United States Patent
Do et al.

(10) Patent No.: US 12,218,176 B2
(45) Date of Patent: Feb. 4, 2025

(54) LIGHT EMITTING ELEMENT AND DISPLAY DEVICE COMPRISING SAME

(71) Applicant: SAMSUNG DISPLAY CO., LTD., Yongin-Si (KR)

(72) Inventors: Young Rag Do, Seoul (KR); Hoo Keun Park, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 637 days.

(21) Appl. No.: 17/423,450

(22) PCT Filed: Nov. 25, 2019

(86) PCT No.: PCT/KR2019/016244
§ 371 (c)(1),
(2) Date: Jul. 15, 2021

(87) PCT Pub. No.: WO2020/149512
PCT Pub. Date: Jul. 23, 2020

(65) Prior Publication Data
US 2022/0069005 A1    Mar. 3, 2022

(30) Foreign Application Priority Data

Jan. 15, 2019    (KR) .................. 10-2019-0005426

(51) Int. Cl.
*H01L 27/15* (2006.01)
*H01L 33/24* (2010.01)
(Continued)

(52) U.S. Cl.
CPC ............ *H01L 27/156* (2013.01); *H01L 33/24* (2013.01); *H01L 33/38* (2013.01); *H01L 33/44* (2013.01);
(Continued)

(58) Field of Classification Search
CPC ....... H01L 33/50–58; H01L 2933/0033–0058; H01L 2933/0091; H01L 27/15–156; H01L 33/36–405; H01L 2933/0025
See application file for complete search history.

(56) References Cited

U.S. PATENT DOCUMENTS

2007/0284600 A1 * 12/2007 Shchekin ................ H01L 33/50
257/E33.068
2012/0001204 A1    1/2012 Jagt
(Continued)

FOREIGN PATENT DOCUMENTS

CN    101009214 A    8/2007
CN    103443942 A * 12/2013 ............. H01L 33/44
(Continued)

OTHER PUBLICATIONS

International Search Report for corresponding Application No. PCT/KR2019/016244 dated Mar. 4, 2020, 4pp.
(Continued)

*Primary Examiner* — Moin M Rahman
*Assistant Examiner* — Eric Manuel Mulero Flores
(74) *Attorney, Agent, or Firm* — Lewis Roca Rothgerber Christie LLP

(57) ABSTRACT

Provided are a light emitting element and a display device comprising same. The light emitting element comprises: a first conductivity type semiconductor doped with a dopant having a first polarity, a second conductivity type semiconductor doped with a dopant having a second polarity opposite to the first polarity; an active layer between the first conductivity type semiconductor and the second conductivity type semiconductor; and an insulation film which surrounds at least a side surface of the active layer, wherein the
(Continued)

insulation film includes an insulation coating film and at least one light conversion particle on at least a portion of the insulation coating film.

12 Claims, 14 Drawing Sheets

(51) Int. Cl.
*H01L 33/38* (2010.01)
*H01L 33/44* (2010.01)
*H01L 33/58* (2010.01)

(52) U.S. Cl.
CPC ...... *H01L 33/58* (2013.01); *H01L 2933/0091* (2013.01)

(56) References Cited

U.S. PATENT DOCUMENTS

| | | | | |
|---|---|---|---|---|
| 2012/0168794 | A1* | 7/2012 | Yu | H01L 33/44 |
| | | | | 257/E33.072 |
| 2014/0183582 | A1* | 7/2014 | Lee | H01L 33/501 |
| | | | | 977/774 |
| 2016/0148911 | A1* | 5/2016 | Do | H05K 1/0295 |
| | | | | 438/28 |
| 2016/0260873 | A1* | 9/2016 | Yamada | H01L 33/502 |
| 2016/0300983 | A1 | 10/2016 | Strassburg et al. | |
| 2017/0250323 | A1* | 8/2017 | Otto | H01L 27/156 |
| 2017/0301831 | A1* | 10/2017 | Yoo | H01L 33/62 |
| 2017/0365751 | A1 | 12/2017 | Butendeich et al. | |
| 2018/0287010 | A1 | 10/2018 | Sung | |

FOREIGN PATENT DOCUMENTS

| | | |
|---|---|---|
| CN | 104094420 A | 10/2014 |
| CN | 105453284 A | 3/2016 |
| CN | 107731972 A | 2/2018 |
| CN | 207338379 U | 5/2018 |
| KR | 10-0714581 B1 | 5/2007 |
| KR | 10-2011-0126095 A | 11/2011 |
| KR | 10-2014-0089641 A | 7/2014 |
| KR | 10-2015-0006798 A | 1/2015 |
| KR | 10-2016-0059574 A | 5/2016 |
| KR | 10-2018-0009015 A | 1/2018 |
| KR | 10-2018-0115173 A | 10/2018 |
| WO | WO 2012/132236 A1 | 10/2012 |
| WO | WO 2016/208993 A1 | 12/2016 |

OTHER PUBLICATIONS

Supplemental Partial European Search Report for corresponding EP Application No. EP 19 90 9832, dated Sep. 12, 2022, 16pp.
Office action issued in CN 201980089149.2, dated Sep. 18, 2023, 8pp.

* cited by examiner

[FIG. 14]
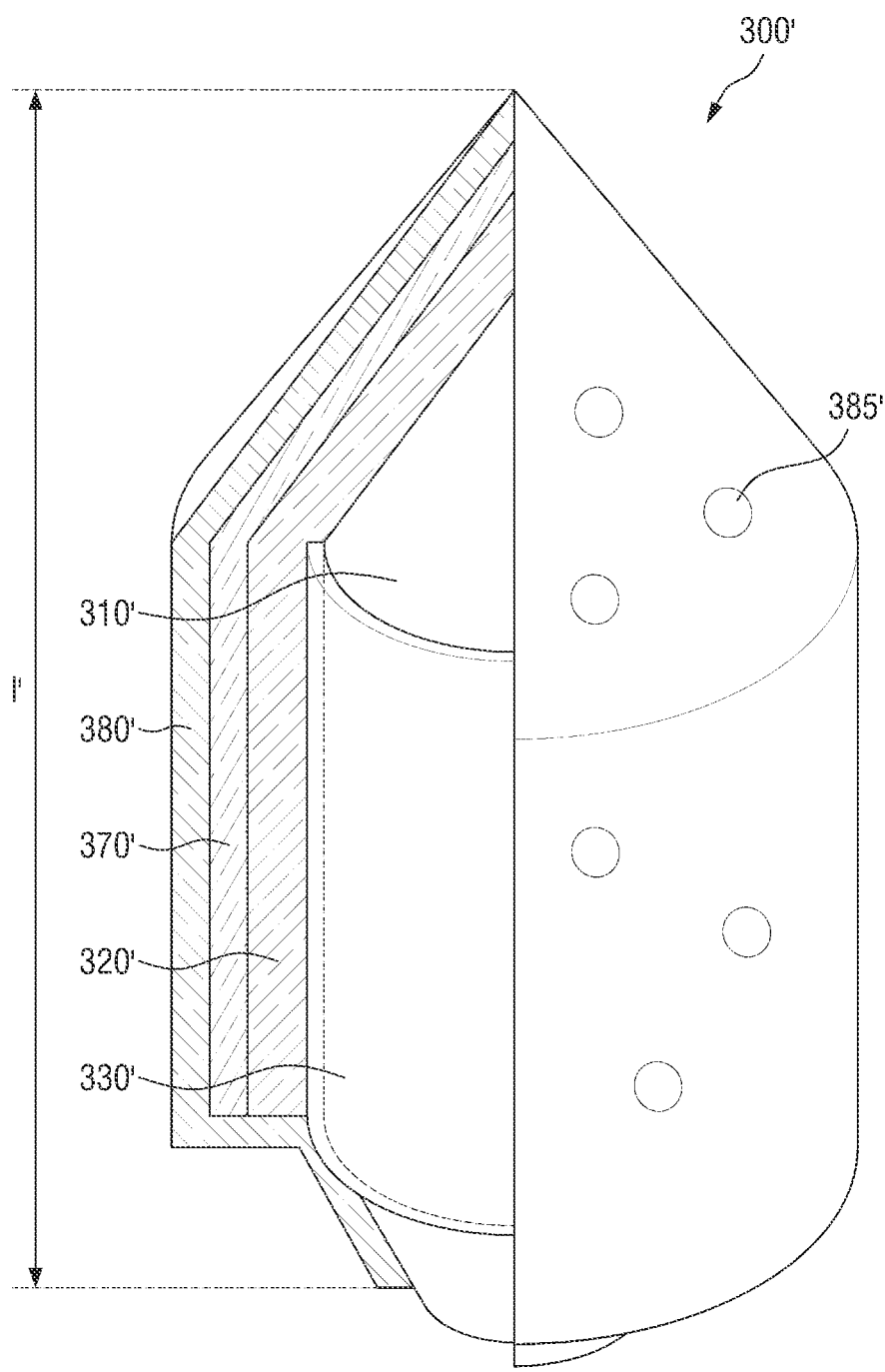

LIGHT EMITTING ELEMENT AND DISPLAY DEVICE COMPRISING SAME

CROSS-REFERENCE TO RELATED APPLICATION

This application is a U.S. National Phase Patent Application of International Patent Application Number PCT/KR2019/016244, filed on Nov. 25, 2019, which claims priority to Korean Patent Application Number 10-2019-0005426, filed on Jan. 15, 2019, the entire content of all of which is incorporated herein by reference.

FIELD

Embodiments of the present disclosure relate to a light emitting element and a display device including the same.

BACKGROUND

With the development of multimedia, display devices are becoming more important. In response to that development, various types of display devices, such as organic light emitting diode (OLED) display devices, liquid crystal display (LCD) devices, and the like, are being used.

A device for displaying an image of a display device includes a display panel such as an OLED panel or an LCD panel. Among the above panels, a light emitting display panel may include a light emitting element. For example, an OLED includes an organic material as a fluorescent material, and an inorganic light emitting diode (LED) uses an inorganic material as a fluorescent material.

The inorganic LED using an inorganic semiconductor as a fluorescent material has durability in a high temperature environment and has an advantage of high efficiency of blue light as compared with the OLED. Further, even in a fabricating process which has been pointed out as a limitation of the conventional inorganic LED element, a transfer method using dielectrophoresis (DEP) has been developed. Therefore, research is being carried out on inorganic LEDs having excellent durability and excellent efficiency as compared with OLEDs.

SUMMARY

Embodiments of the present disclosure are directed to providing a light emitting element including a semiconductor crystal and an insulation film surrounding the semiconductor crystal, wherein the insulation film includes an insulation coating film and a scattering particle disposed on the insulation coating film to provide the light emitting element from which emitted light travels in one direction.

In addition, the present disclosure is directed to providing a display device including the light emitting element and having improved top emission efficiency using the light emitting element disposed horizontally.

It should be noted that objects of the present disclosure are not limited to the above-described objects, and other objects of the present disclosure will be apparent to those skilled in the art from the following descriptions.

According to an embodiment, a light emitting element includes a first conductivity type semiconductor doped with a dopant having a first polarity, a second conductivity type semiconductor doped with a dopant having a second polarity opposite to the first polarity, an active layer between the first conductivity type semiconductor and the second conductivity type semiconductor, and an insulation film which surrounds at least a side surface of the active layer, wherein the insulation film includes an insulation coating film and at least one light conversion particle on at least a portion of the insulation coating film.

The first conductivity type semiconductor, the active layer, and the second conductivity type semiconductor may be arranged in a first direction, and the active layer emits light.

The light emitted from the active layer may include first emitted light that propagates toward both ends of the light emitting element in the first direction, and second emitted light that propagates in a second direction different from the first direction.

At least a portion of the second emitted light may be incident on the at least one light conversion particle and be emitted from the active layer in a direction perpendicular to the first direction.

In the light emitting element, an amount of the light emitted in a direction perpendicular to the first direction may be greater than an amount of the light emitted in the first direction.

The at least one light conversion particle may include at least any one selected from a first light conversion particle that scatters incident light emitted from the active layer, and a second light conversion particle that amplifies the intensity of the incident light.

The first light conversion particle may include at least any one selected from among silicon nitride ($Si_3N_4$), silicon dioxide ($SiO_2$), aluminum oxide ($Al_2O_3$), hafnium oxide ($HfO_2$), yttrium oxide ($Y_2O_3$), and titanium dioxide ($TiO_2$).

A diameter of the first light conversion particle may be in a range from 100 nm to 2000 nm.

The second light conversion particle may include at least any one selected from among gold (Au), silver (Ag), copper (Cu), and aluminum (Al).

A diameter of the second light conversion particle may be in a range from 10 nm to 300 nm.

The light emitting elements may further include a particle area defined as an area in which the at least one light conversion particle is on the insulation coating film, wherein the particle area may be on the insulation coating film to overlap at least the active layer.

The particle area may have a shape extending in the first direction.

A ratio of the particle area to an area of an outer surface of the insulation coating film may be in a range from 0.5 to 0.6.

The light emitting element may have a length in a range from 4 μm to 7 μm and an aspect ratio in a range from 1.2 to 100.

According to another embodiment, a display device includes a base layer, a first electrode and a second electrode which are separated from each other on the base layer in a first direction, and at least one light emitting element between the first electrode and the second electrode, wherein the at least one light emitting element includes a semiconductor crystal having a shape extending in the first direction to emit light in a set wavelength range, and an insulation film to surround a side surface of the semiconductor crystal, and the insulation film includes an insulation coating film and at least one light conversion particle on at least a portion of the insulation coating film.

At least some of the light emitted from the semiconductor crystal may be incident on the at least one light conversion particle and emitted in a direction different from the first direction.

In the at least one light emitting element, an amount of light emitted in a direction perpendicular to the first direction may be greater than an amount of the light emitted in the first direction.

The at least one light conversion particle may include at least any one selected from a first light conversion particle that scatters incident light, and a second light conversion particle that amplifies the intensity of the incident light.

The at least one light emitting element may include a first light emitting element and a second light emitting element, and the first light emitting element and the second light emitting element may have different separation distances from the base layer in a second direction perpendicular to the base layer.

The display device may further include a first contact electrode in contact with the first electrode and one end portion of the at least one light emitting element, and a second contact electrode in contact with the second electrode and the other end portion of the at least one light emitting element.

The details of other embodiments are included in the detailed description and the accompanying drawings.

A light emitting element according to embodiments includes light conversion particles so that light emitted from an active layer cannot be reflected from an insulation coating film and can be emitted to the outside through the light conversion particles. The light conversion particles can scatter the light incident from the active layer or amplify the intensity of the incident light to increase an amount of the light emitted from the light emitting element in one direction.

In addition, a display device according to embodiment can include a light emitting element in which an amount of light emitted in a direction perpendicular to an extension direction can be increased. Thus, the display device includes the light emitting element disposed in a horizontal direction and thus top emission efficiency can be improved.

The effects according to the embodiments are not limited by the contents exemplified above, and more various effects are included in this disclosure.

BRIEF DESCRIPTION OF THE DRAWINGS

FIG. 14 is a schematic diagram illustrating a light emitting element according to another embodiment.

DETAILED DESCRIPTION

Embodiments of the present disclosure will now be described more fully hereinafter with reference to the accompanying drawings, in which preferred embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments of the present disclosure will be described with reference to the accompanying drawings.

Figure 1:
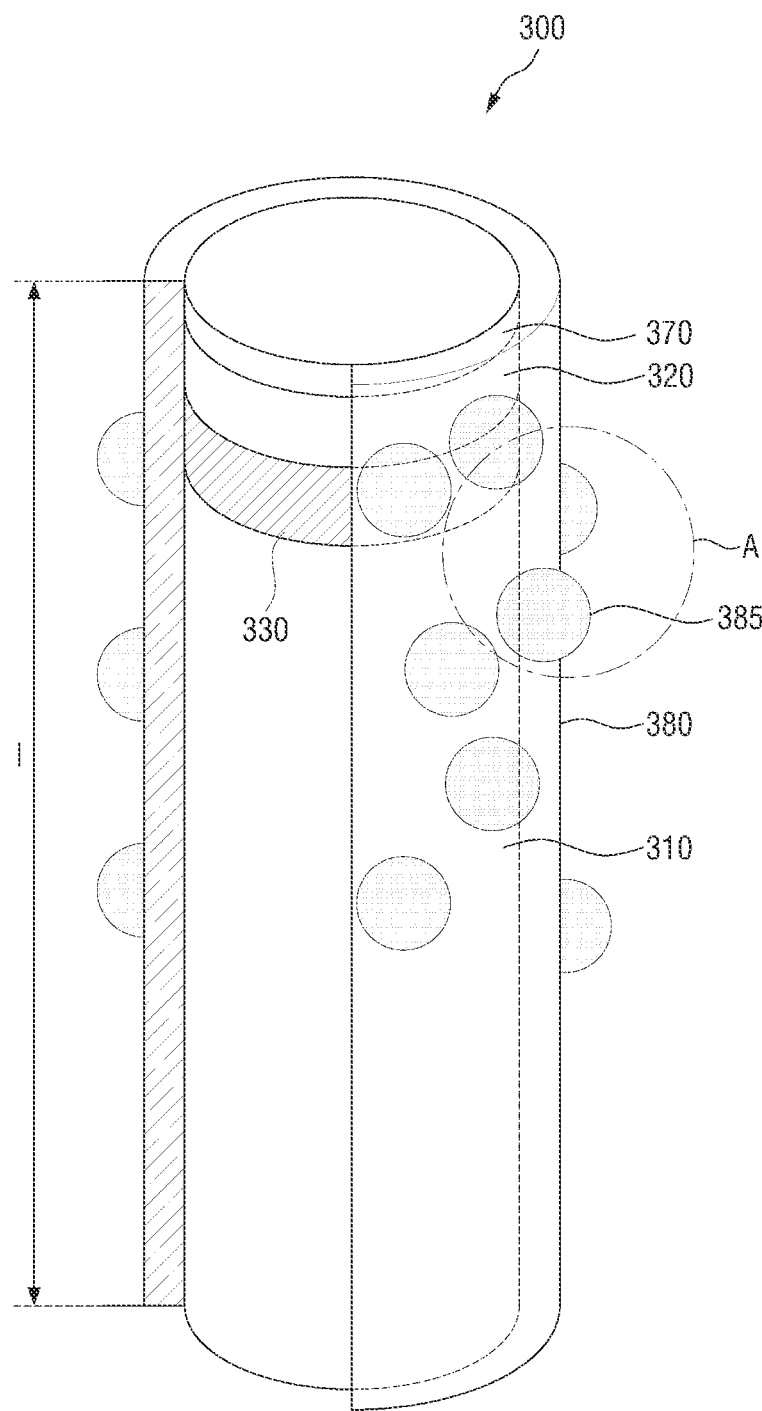
FIG. 1 is a schematic diagram illustrating a light emitting element according to one embodiment.

FIG. 1 is a schematic diagram illustrating a light emitting element according to one embodiment.

A light emitting element 300 may be a light emitting diode (LED), for example, the light emitting element 300 may be an inorganic LED having a micrometer unit or nanometer unit size and made of an inorganic material. In the case of the light emitting element 300 being an inorganic LED, when an electric field is formed in a set or specific direction between two electrodes opposite to each other, the inorganic LED may be disposed between the two electrodes, each having a polarity (e.g., each having a polarity opposite to that of the other). The light emitting element 300 may receive a set or predetermined electrical signal from a connected electrode to emit light in a set or specific wavelength range.

The light emitting element 300 may include a semiconductor crystal doped with an arbitrary conductivity type (e.g., p-type or n-type) of impurity. The semiconductor crystal may receive an electrical signal applied from an external power source and emit light in a set or specific wavelength range.

Referring to FIG. 1, the light emitting element 300 according to one embodiment may include a first conductivity type semiconductor 310, a second conductivity type semiconductor 320, an active layer 330, and an insulation film 380. In addition, the light emitting element 300 according to one embodiment may further include at least one conductive electrode layer 370. Although the light emitting element 300 is illustrated as including one conductive electrode layer 370 in FIG. 1, the present disclosure is not limited thereto. In some cases, the light emitting element 300 may include a greater number of conductive electrode layers 370 or the conductive electrode layer 370 may be omitted. A description of the light emitting element 300, which will be made below, may be identically applied even when the number of conductive electrode layers 370 is varied or another structure is further included.

In this disclosure, terms "first," "second," and the like are used to refer to respective components, but these are used to simply distinguish the components from each other and do not necessarily refer to a corresponding component. That is, the components defined as first, second, and the like are not necessarily limited to a set or specific structure or location and, in some cases, other numbers may be assigned to the components. Therefore, the number assigned to each component may be described through the drawings and the following description, and a first component mentioned below may be a second component within the technical idea of the present disclosure.

The light emitting element 300 may have a shape extending in one direction. The light emitting element 300 may have a shape of nanorods, nanowires, nanotubes, and/or the like. In an embodiment, the light emitting element 300 may be a cylindrical shape or a rod shape. However, the shape of the light emitting element 300 is not limited thereto and may have various suitable shapes such as a regular hexahedral shape, a rectangular parallelepiped shape, a hexagonal column shape, and the like. A plurality of semiconductors included in the light emitting element 300, which will be described below, may have a structure in which the semiconductors are sequentially arranged in the one direction or stacked.

The light emitting element 300 according to one embodiment may emit light in a set or specific wavelength range. In an example, the active layer 330 may emit blue light having a central wavelength range in a range from 450 nm to 495 nm. However, the central wavelength range of the blue light is not limited to the above range, and it should be understood that the central wavelength range includes all wavelength ranges which can be recognized as a blue color in the art. Further, the light emitted from the active layer 330 of the light emitting element 300 is not limited thereto, and the light may be green light having a central wavelength range in a range from 495 nm to 570 nm or red light having a central wavelength range in a range from 620 nm to 750 nm.

To describe the light emitting element 300 in more detail with reference to FIG. 1, the first conductivity type semiconductor 310 may be an n-type semiconductor having, for example, a first conductivity type. For example, when the light emitting element 300 emits light in a blue wavelength range, the first conductivity type semiconductor 310 may include a semiconductor material having a chemical formula of $In_xAl_yGa_{1-x-y}N$ ($0 \leq x \leq 1$, $0 \leq y \leq 1$, and $0 \leq x+y \leq 1$). For example, the semiconductor material may be one or more selected from among InAlGaN, GaN, AlGaN, InGaN, AlN, and InN which are doped with an n-type. The first conductivity type semiconductor 310' may be doped with a first conductivity type dopant. For example, the first conductivity type dopant may be Si, Ge, Sn, and/or the like. In an example, the first conductivity type semiconductor 310 may be n-GaN doped with n-type Si. A length of the first conductivity type semiconductor 310 may be in a range from 1.5 μm to 5 μm, but the present disclosure is not limited thereto.

The second conductivity type semiconductor 320 is disposed on the active layer 330 which will be further described below. For example, the second conductivity type semiconductor 320 may be a p-type semiconductor having a second conductivity type. For example, when the light emitting element 300 emits light in a blue or green wavelength range, the second conductivity type semiconductor 320 may include a semiconductor material having a chemical formula of $n_xAl_yGa_{1-x-y}N$ ($0 \leq x \leq 1$, $0 \leq y \leq 1$, and $0 \leq x+y+1$). For example, the semiconductor material may be one or more selected from among InAlGaN, GaN, AlGaN, InGaN, AlN, and InN which are doped with a p-type. The second conductivity type semiconductor 320 may be doped with a second conductivity type dopant. For example, the second conductivity type dopant may be Mg, Zn, Ca, Se, Ba, and/or the like. In an example, the second conductivity type semiconductor 320 may be p-GaN doped with p-type Mg. A length of the second conductivity type semiconductor 320 may be in a range from 0.08 μm to 0.25 μm, but the present disclosure is not limited thereto.

In the drawings, although each of the first conductivity type semiconductor 310 and the second conductivity type semiconductor 320 is illustrated as being formed of one layer, the present disclosure is not limited thereto. In some cases, each of the first conductivity type semiconductor 310 and the second conductivity type semiconductor 320 may further include a greater number of layers, for example, a clad layer and/or a tensile strain barrier reducing (TSBR) layer according to a material of the active layer 330.

The active layer 330 is disposed between the first conductivity type semiconductor 310 and the second conductivity type semiconductor 320. The active layer 330 may include a material having a single or multiple quantum well structure. When the active layer 330 includes a material having a multiple quantum well structure, the active layer 330 may have a structure in which a plurality of quantum layers and a plurality of well layers are alternately stacked. The active layer 330 may emit light due to combination of electron-hole pairs in response to an electrical signal applied through the first conductivity type semiconductor 310 and the second conductivity type semiconductor 320. An example, when the active layer 330 emits light in a blue wavelength range, the active layer 330 may include a material such as AlGaN, AlInGaN, and/or the like. In one or more embodiments, when the active layer 330 has a multi-quantum well structure in which quantum layers and well layers are alternately stacked, the quantum layer may include a material such as AlGaN and/or AlInGaN, and the well layer may include a material such as GaN and/or AlInN. In an example, the active layer 330 includes AlGaInN as the quantum layer and AlInN as the well layer. As described above, the active layer 330 may emit blue light having a central wavelength range in a range from 450 nm to 495 nm.

However, the present disclosure is not limited thereto, and the active layer 330 may have a structure in which a semiconductor material having large band gap energy and a semiconductor material having small band gap energy are alternately stacked or include different Group III to VI semiconductor materials according to a wavelength range of emitted light. The active layer 330 is not limited to emit light in the blue wavelength range, and in some cases, the active layer 330 may emit light in a red or green wavelength range. A length of the active layer 330 may be in a range from 0.05 μm to 0.25 μm, but the present disclosure is not limited thereto.

The light emitted from the active layer 330 may be emitted to an outer surface of the light emitting element 300 in a lengthwise direction and both side surfaces thereof. The directivity of the light emitted from the active layer 330 is not limited to any one direction.

The conductive electrode layer 370 may be an ohmic contact electrode. However, the present disclosure is not limited thereto, and the conductive electrode layer 370 may be a Schottky contact electrode. The conductive electrode layer 370 may include a conductive metal (e.g., an electrically conductive metal). For example, the conductive electrode layer 370 may include at least one selected from among aluminum (Al), titanium (Ti), indium (In), gold (Au), silver (Ag), indium tin oxide (ITO), indium zinc oxide (IZO), and indium tin-zinc oxide (ITZO). In addition, the conductive electrode layer 370 may include a semiconductor material doped with an n-type or p-type. The conductive electrode layer 370 may include the same material or different materials, but the present disclosure is not limited thereto.

The insulation film 380 surrounds the outer surfaces of the plurality of semiconductors, which are described above. In an example, the insulation film 380 may surround at least the outer surface of the active layer 330 and may extend in one direction in which the light emitting element 300 extends. The insulation film 380 may serve to protect members of the light emitting element 300. As an example, the insulation film 380 may be formed to surround side surfaces of the members and expose two end portions of the light emitting element 300 in the lengthwise direction.

In the drawing, the insulation film 380 is illustrated as being formed to extend in the lengthwise direction of the light emitting element 300 to cover from the first conductivity type semiconductor 310 to the conductive electrode layer 370, but the present disclosure is not limited thereto. The insulation film 380 covers only the outer surfaces of some semiconductor layers including at least the active layer 330 or covers only a portion of the outer surface of the conductive electrode layer 370 so that a portion of the outer surface of the conductive electrode layer 370 may be exposed.

A thickness of the insulation film 380 may be in a range from 10 nm to 1.0 μm, but the present disclosure is not limited thereto. For example, the thickness of the insulation film 380 may be 40 nm.

According to one embodiment, in order to allow the light emitted from the active layer 330 of the light emitting element 300 to be transmitted without being reflected from the insulation film 380, the insulation film 380 may include an insulation coating film 381 and light conversion particles 385 disposed on at least a portion of the insulation coating film 381.

Figure 2:
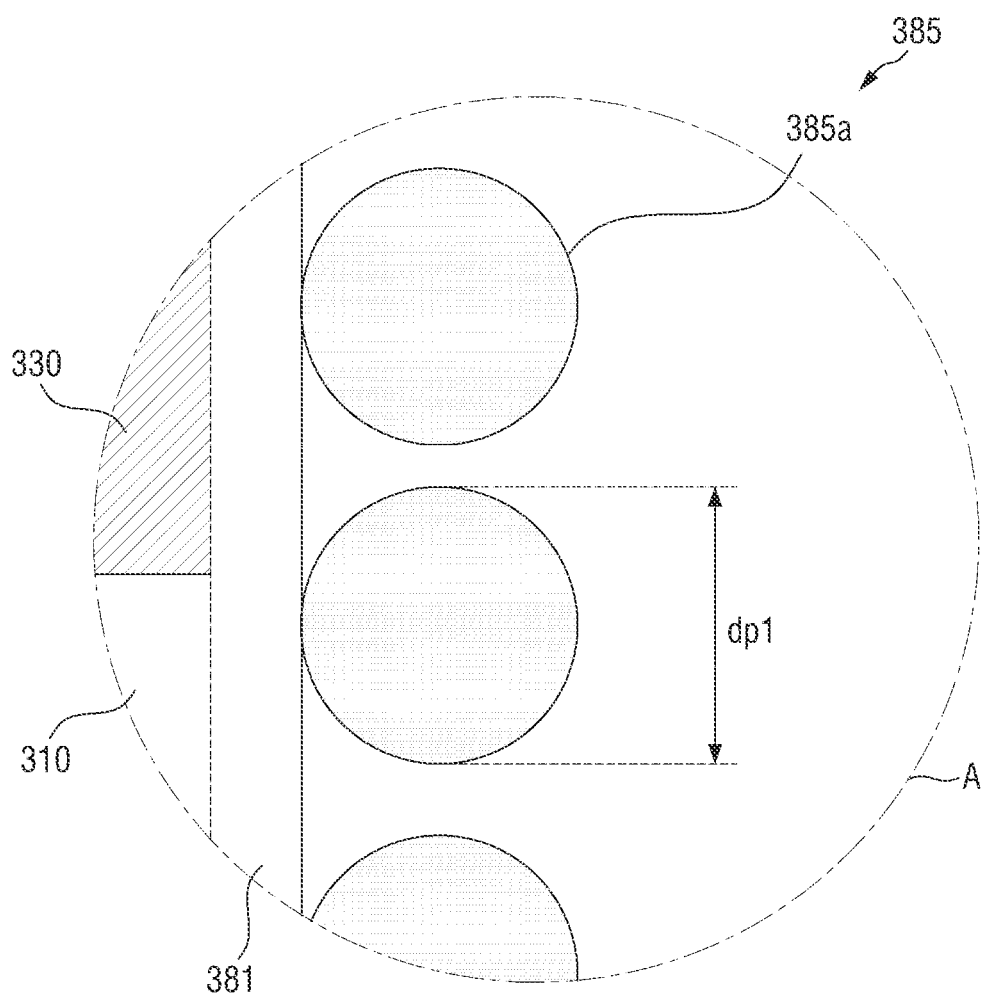
FIG. 2 is an enlarged view of Portion A of FIG. 1.
Figure 3:
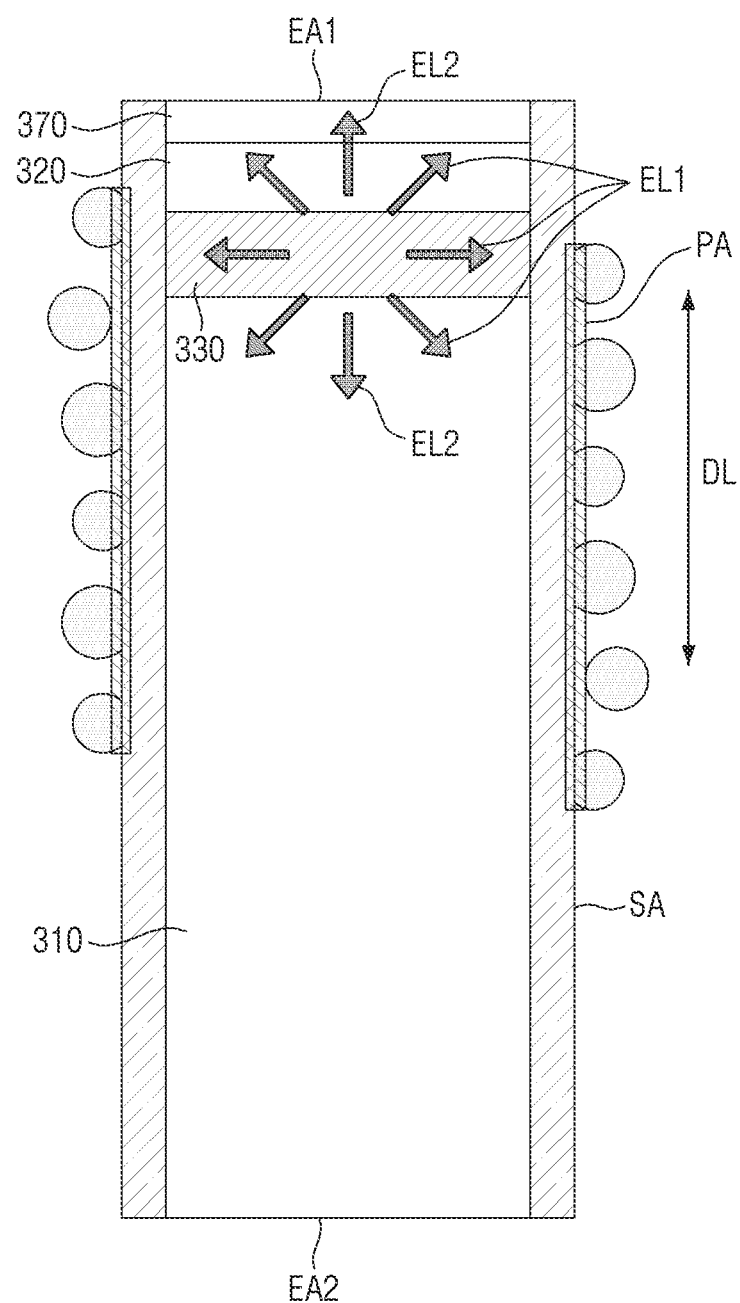
FIG. 3 is a cross-sectional view illustrating the light emitting element according to one embodiment.

FIG. 2 is an enlarged view of Portion A of FIG. 1. FIG. 3 is a cross-sectional view illustrating the light emitting element according to one embodiment.

Referring to FIGS. 1 to 3, the insulation coating film 381 is formed to surround the plurality of semiconductors. The insulation coating film 381 is disposed to surround the outer surface of the light emitting element 300 including the active layer 330.

The insulation coating film 381 may include materials having insulation properties (e.g., electrically insulating properties), for example, silicon oxide ($SiO_x$), silicon nitride ($SiN_x$), silicon oxynitride ($SiO_xN_y$), aluminum nitride (AlN), aluminum oxide ($Al_2O_3$), hafnium oxide ($HfO_2$), yttrium oxide ($Y_2O_3$), titanium dioxide ($TiO_2$), and/or the like. Thus, it is possible to prevent (or reduce an occurrence or likelihood of) an electrical short circuit which may occur when the active layer 330 is in direct contact with an electrode through which an electrical signal is transmitted to the light emitting element 300, thereby preventing or reducing the degradation of light emission efficiency. In addition, the insulation coating film 381 includes a transparent material, and thus light emitted from the active layer 330 may pass through the insulation coating film 381.

The light conversion particle 385 is disposed on the insulation coating film 381. A plurality of light conversion particles 385 may be disposed to be spaced apart from each other, thereby forming one layer which partially covers the insulation coating film 381. The light conversion particles 385 may be entirely disposed on the insulation coating film 381, but the present disclosure is not limited thereto, and the light conversion particles 385 may be disposed on only a partial area. In an example, the light conversion particle 385 is disposed on the insulation coating film 381, and an area in which the light conversion particle 385 is disposed may overlap at least the active layer 330. A further detailed description thereof will be made below.

The light conversion particle 385 may be disposed to be attached, adsorbed, or bonded on the insulation coating film 381. A physical bond or a chemical bond may be formed between the light conversion particle 385 and the insulation coating film 381, and the type of bond is not particularly limited. As an example, the light conversion particle 385 may be physically adsorbed onto the insulation coating film 381. A shape of the light conversion particle 385 may be a spherical shape or an elliptical shape. However, the shape of the light conversion particle 385 is not particularly limited, and although a spherical-shaped light conversion particle 385 is illustrated in the drawings, the present disclosure is not limited thereto.

As shown in FIG. 3, in the light emitting element 300, a semiconductor crystal, for example, the first conductivity type semiconductor 310, the second conductivity type semiconductor 320, and the active layer 330 may be disposed in one direction DL (hereinafter referred to as an "extension direction") in which the light emitting element 300 extends, and the insulation coating film 381 may be formed to surround the first conductivity type semiconductor 310, the second conductivity type semiconductor 320, and the active layer 330. When a set or predetermined electrical signal is transmitted from the two end portions of the light emitting element 300, the active layer 330 may emit light in a set or specific wavelength range.

Light emitted from the active layer 330 may propagate in all directions (e.g., substantially all directions) without directivity. For example, light EL emitted from the active layer 330 may include second emitted light EL2 parallel (e.g., substantially parallel) to the extension direction DL of the light emitting element 300 and first emitted light EL1 not parallel to the extension direction DL. The first emitted light EL1 is emitted from the active layer 330 to propagate toward a side surface SA of the light emitting element 300, and the second emitted light EL2 propagates toward the two end portions of the light emitting element 300, for example, a first end portion EA1 and a second end portion EA2, in the one direction DL.

In the drawing, the first emitted light EL1 is illustrated as including light propagating in a direction perpendicular (e.g., substantially perpendicular) to the one direction DL and light propagating in a diagonal direction and the present disclosure is not limited thereto. In the following description, it can be understood that the second emitted light EL2 includes light propagating toward the two end portions EA1 and EA2 of the light emitting element 300 in a direction that is substantially the same as the extension direction DL, and the first emitted light EL1 is light, except for the second emitted light EL2, including light propagating toward the side surface SA of the emitting element 300.

The light emitting element 300 may include an insulation coating film 381 surrounding at least the active layer 330, and the first emitted light EL1 emitted from the active layer 330 may propagate to the insulation coating film 381 of the light emitting element 300. As described above, the insulation coating film 381 may include a transparent material and may include an insulating material to have a set or predetermined refractive index. The first emitted light EL1 may be incident on the insulation coating film 381, may not be emitted from an interface between the insulation coating film 381 and the outside and may be reflected again. Thus, a case in which the reflected first emitted light EL1 may propagate toward an area in which the insulation coating film 381 is not formed, for example, the first and second end portions EA1 and EA2, to be emitted in the same direction as the second emitted light EL2 may occur.

As described below, the light emitting element 300 may be disposed on a target substrate, and the extension direction DL may be disposed parallel (e.g., substantially parallel) to one surface of the target substrate. That is, the light emitting element 300 may be disposed in a direction horizontal relative to the target substrate. Light emitted from the light emitting element 300 may be emitted from the side surface SA of the light emitting element 300 to propagate toward an upper portion of the one surface of the target substrate. However, as described above, when the first emitted light EL1 propagating toward the side surface SA of the light emitting element 300 is reflected from the insulation coating film 381 to be emitted in the same direction as the second emitted light EL2, top emission efficiency of the light emitting element 300 disposed horizontally may be reduced.

According to one embodiment, the insulation film 380 of the light emitting element 300 may include the light conversion particles 385 disposed on the insulation coating film 381, and the light conversion particles 385 may emit light, which is emitted from the active layer 330 to propagate toward the insulation coating film 381, for example, the first emitted light EL1, to the outside of the light emitting element 300. That is, the light conversion particles 385 may provide optical paths to allow light incident on the side surface SA of the light emitting element 300 to be emitted as it is without being reflected from the insulation coating film 381.

Figure 4:
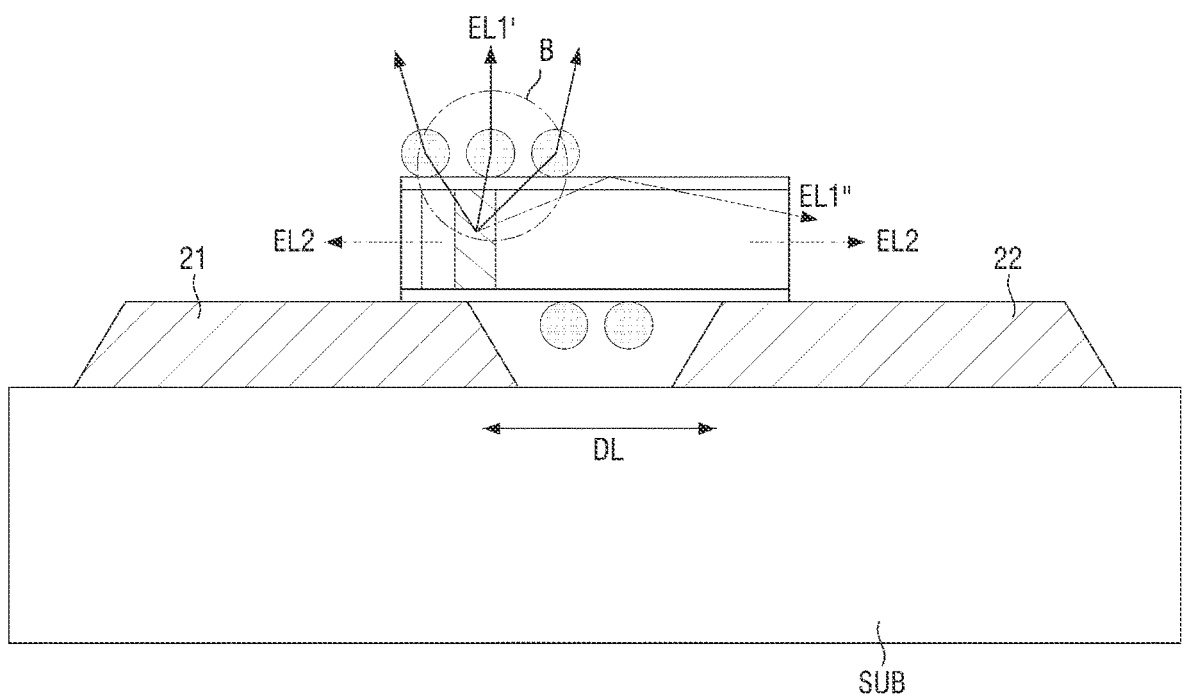
FIG. 4 is a schematic diagram illustrating a propagation direction of light emitted from the light emitting element according to one embodiment.
Figure 5:
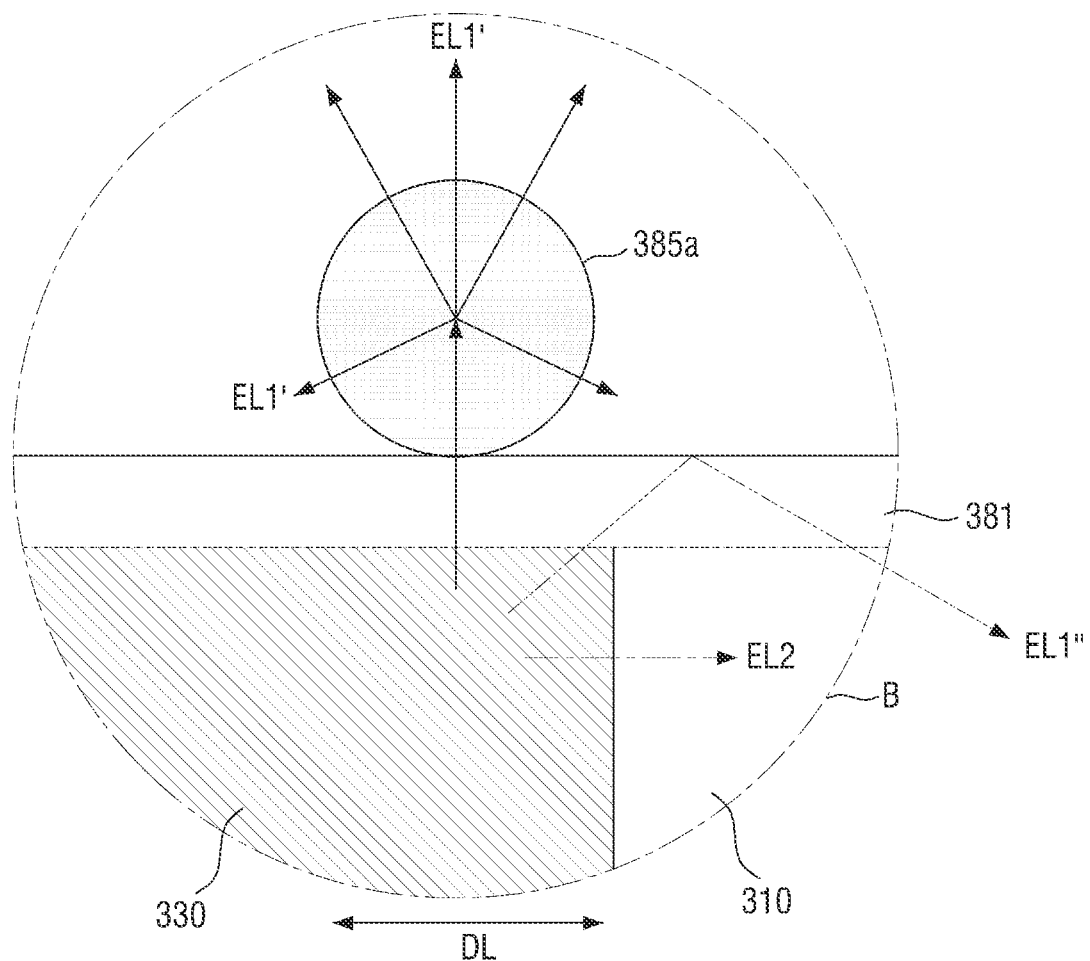
FIG. 5 is an enlarged view of Portion B of FIG. 4.

FIG. 4 is a schematic diagram illustrating a propagation direction of light emitted from the light emitting element according to one embodiment. FIG. 5 is an enlarged view of Portion B of FIG. 4.

Referring to FIGS. 2, 4, and 5, in an example, the light emitting element 300 may be disposed between electrodes 21 and 22 on a target substrate SUB. The first electrode 21 and the second electrode 22 may be disposed on the target substrate SUB. The first electrode 21 and the second electrode 22 are separated in a direction parallel (e.g., substantially parallel) to one surface of the target substrate SUB, and the light emitting element 300 is disposed such that the extension direction DL is parallel (e.g., substantially parallel) to the one surface of the target substrate SUB. The two end portions of the light emitting element 300 are disposed on the first electrode 21 and the second electrode 22, respectively.

However, the present disclosure is not limited thereto, and an arrangement structure of the light emitting element 300 may be varied. The two end portions of the light emitting element 300 may be connected to at least one of the first electrode 21 and the second electrode 22 and may receive a set or predetermined electrical signal to emit light.

As shown in FIGS. 4 and 5, the light emitted from the active layer 330 of the light emitting element 300 may be emitted toward the two end portions EA1 and EA2 of the light emitting element 300 or the insulation coating film 381 of the side surface SA. The second emitted light EL2 emitted toward the two end portions EA1 and EA2 of the light emitting element 300 may be lost without propagating toward an upper portion of the target substrate SUB.

On the other hand, the first emitted light EL1 propagating toward the side surface SA of the light emitting element 300, that is, the insulation coating film 381, may be emitted from the light emitting element 300 and may propagate toward an upper surface of the target substrate SUB to be displayed to the outside. When an amount of first emitted light EL1 emitted from the light emitting element 300 to the side surface SA is increased, top emission efficiency of the light emitting element 300 disposed on the target substrate SUB may be increased.

To describe in further detail with reference to FIG. 5, the active layer 330 emits the second emitted light EL2 in the extension direction DL of the light emitting element 300 and emits the first emitted light EL1 in a direction perpendicular (e.g., substantially perpendicular) to the extension direction DL or in a direction inclined thereto. The second emitted light EL2 propagate in the extension direction DL to be emitted to the two end portions EA1 and EA2 of the light emitting element 300.

Some of the first emitted light EL1 is incident on the light conversion particles 385 through the insulation coating film 381, and the remainder is reflected from the interface between the insulation coating film 381 and the outside. The light incident on the light conversion particle 385 is emitted from the light emitting element 300 through the light conversion particles 385 (EL1' in FIG. 5), and the light reflected from the insulation coating film 381 is emitted in the extension direction DL of the light emitting element 300. (EL1" in FIG. 5).

The light emitted from the light emitting element 300 may be emitted to the two end portions EA1 and EA2 in the same direction as the extension direction DL (EL1" and EL2 in FIG. 5) and emitted in a direction different from the extension direction DL, for example, emitted to the side surface SA in a direction perpendicular (e.g., substantially perpendicular) to the extension direction DL (EL1' in FIG. 5). As described above, in the light emitting element 300, the extension direction DL is disposed in a direction parallel (e.g., substantially parallel) to the target substrate SUB, and the light emitted to the side surface SA of the light emitting element 300 may be visually recognized in a direction facing the target substrate SUB. That is, when an amount of light emitted to the side surface SA of the light emitting element 300 instead of the two end portions EA1 and EA2 among the light emitted from the active layer 330 is increased, top emission efficiency of the target substrate SUB may be increased.

The light emitting element 300 according to one embodiment includes the light conversion particles 385 disposed on the insulation coating film 381, and thus the amount of light emitted to the side surface SA of the light emitting element 300 may be increased. In particular, among the light incident on the insulation coating film 381, the amount of light reflected from the interface between the insulation coating film 381 and the outside (EL1" in FIG. 5) may be reduced, and the amount of light emitted through the light conversion particles 385 (EL1' in FIG. 5) may be increased. The amount of light emitted to the side surface SA of the light emitting element 300 may be increased, and the top emission efficiency of the light emitting element 300 disposed on the target substrate SUB may be improved.

As described above, the light conversion particles 385 providing a movement path for light emitted from the active layer 330 may scatter incident light, change a path thereof, or amplify the intensity thereof. In an example, the light conversion particles 385 may be first light conversion particles 385a containing dielectric materials or second light conversion particles 385b containing noble metal particles.

Referring to FIGS. 2 and 5, the light conversion particle 385 may include the first light conversion particle 385a to provide an optical path for light emitted from the active layer 330 and, concurrently (e.g., simultaneously), scatter the light. The first light conversion particle 385a may include a dielectric material to scatter light incident from the insulation coating film 381. That is, the first light conversion particle 385a may be a scattering particle including a dielectric material.

As shown in the drawings, the first emitted light EL1 incident on the first light conversion particle 385a may be scattered and emitted in all directions regardless of a propagation path (EL1' in FIG. 5). However, in order to increase the amount of light emitted to the side surface SA of the light emitting element 300, that is, the amount of light emitted in a direction perpendicular (e.g., substantially perpendicular) to the extension direction DL, the first light conversion particle 385a may scatter a larger amount of light in the same direction as the propagation direction of incident light. In other words, the first light conversion particle 385a may include a material which causes Mie scattering.

In an example, the first light conversion particle 385a may include a dielectric material having a refractive index of 1.5 or more. For example, the first light conversion particle 385a may include at least any one selected from among silicon nitride ($Si_3N_4$), silicon dioxide ($SiO_2$), aluminum oxide ($Al_2O_3$), hafnium oxide ($HfO_2$), yttrium oxide ($Y_2O_3$), and titanium dioxide ($TiO_2$). In addition, the first light conversion particle 385a may have a diameter dp1 in a range from 100 nm to 2000 nm. However, the present disclosure is not limited thereto.

Like the first light conversion particle 385a, the light conversion particle 385 may scatter incident light to control a propagation direction of the emitted light. Unlike the first light conversion particle 385a, the light conversion particle 385 may amplify the intensity of the incident light.

According to one embodiment, the light conversion particle 385 may include a second light conversion particle 385b to provide an optical path of light emitted from the active layer 330 and, concurrently (e.g., simultaneously), amplify the intensity of the light.

Figure 6:
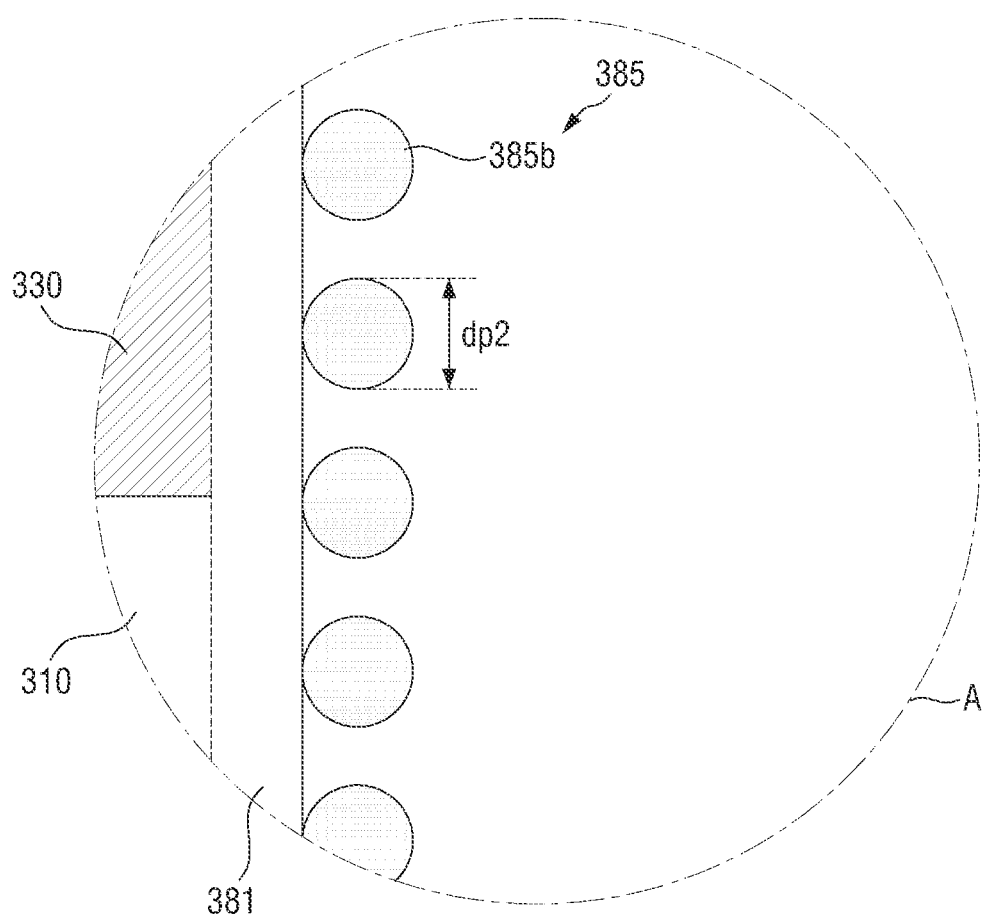
FIG. 6 is an enlarged view illustrating an outer surface of a light emitting element according to another embodiment.
Figure 7:
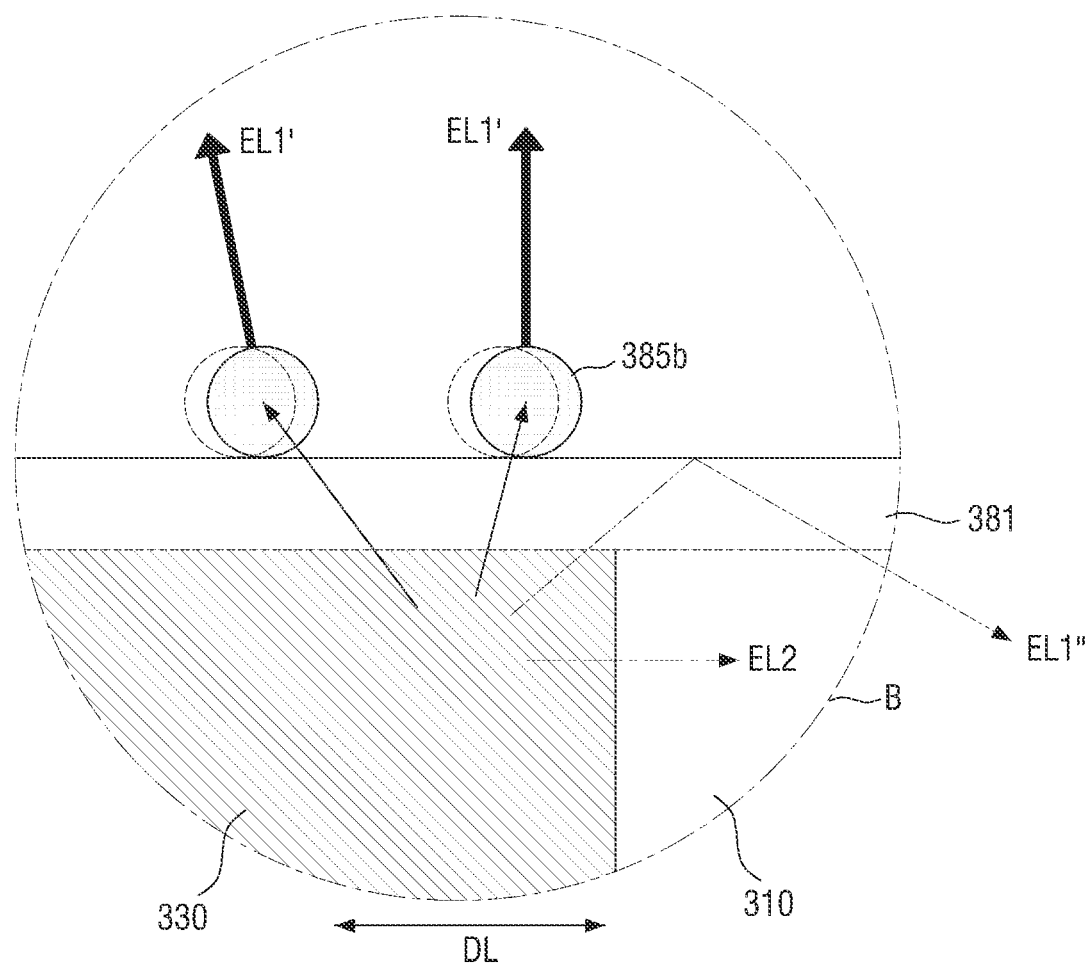
FIG. 7 is a schematic diagram illustrating the propagation of light emitted from the light emitting element of FIG. 6.

FIG. 6 is an enlarged view illustrating an outer surface of a light emitting element according to another embodiment. FIG. 7 is a schematic diagram illustrating the propagation of light emitted from the light emitting element of FIG. 6.

Referring to FIGS. 6 and 7, a light emitting element 300 includes the second light conversion particle 385b, and a plurality of second light conversion particles 385b may be disposed on an insulation coating film 381, Like the first light conversion particle 385a, the second light conversion particle 385b may be physically or chemically bonded to the insulation coating film 381. For example, the second light conversion particle 385b may be adsorbed and disposed on the insulation coating film 381.

The second light conversion particle 385b may amplify the intensity of light incident through the insulation coating film 381. For example, the second light conversion particle 385b may include a noble metal particle having a small particle size to generate surface plasmon resonance (SPR) with incident light. In a noble metal particle having a diameter that is smaller than a wavelength of the incident light, a plasmon electron may cause a resonance phenomenon with the incident light. The intensity of the light resonated with the plasmon electron may be amplified, and light efficiency may be increased. That is, the second light conversion particle 385b may be a plasmon particle.

As shown in FIG. 7, the second light conversion particles 385b disposed on the insulation coating film 381 may amplify the intensity of first emitted light EL1 incident from an active layer 330. The intensity of light emitted through the second light conversion particles 385b (EL1' of FIG. 7) is amplified due to SPR. When the light emitting element 300 includes the second light conversion particles 385b, the intensity of light emitted from the side surface SA may be increased.

In an example, the second light conversion particle 385b may include at least any one selected from among Au, Ag, copper (Cu), and Al, and a diameter dp2 may be in a range of 10 nm to 300 nm. However, the present disclosure is not limited thereto.

The light emitting element 300 according to one embodiment may include at least any one selected from the first light conversion particle 385a and the second light conversion particle 385b to increase an amount and the intensity of light emitted to the side surface SA of the light emitting element 300. Thus, the light emitting element 300 disposed parallel (e.g., substantially parallel) to the target substrate SUB is included in the extension direction DL so that top emission efficiency of the target substrate SUB may be increased.

The light conversion particle 385 may be disposed on at least a portion of the insulation coating film 381 to cover at least an area overlapping the active layer 330. In the light emitting element 300 according to one embodiment, a particle area PA, which is an area in which the light conversion particle 385 is disposed on the insulation coating film 381, may be disposed to partially cover the insulation coating film 381 and cover at least the active layer 330.

Referring to FIG. 3 again, the particle area PA, which is an area in which the light conversion particle 385 is disposed, may be defined on the insulation coating film 381 of the light emitting element 300. The light conversion particles 385 may entirely cover an outer surface of the insulation coating film 381, but as shown in the drawing, the light conversion particle 385 is not disposed in some areas of the insulation coating film 381 so that the insulation coating film 381 may be exposed. In order to allow the first emitted light EL1 emitted from the active layer 330 and propagating toward the insulation coating film 381 to be emitted through the light conversion particles 385 without being reflected, the particle area PA may be disposed adjacent to the active layer 330. In an example, the particle area PA may be disposed to overlap at least the active layer 330 and may have a shape extending in the extension direction DL of the light emitting element 300.

In addition, according to one embodiment, among the outer surface of the insulation coating film 381, an area in which the particle area PA is disposed may be more than half of the outer surface. A ratio of the particle area PA to the outer surface of the insulation coating film 381 may be in a range from 0.5 to 0.6. The particle area PA is disposed to overlap at least the active layer 330, and the area in which the particle area PA is disposed may occupy 50% or more, preferably, 50% or more and 60% or less, of the outer surface of the insulation coating film 381.

Although the particle area PA is illustrated as being continuously formed on the insulation coating film 381, the present disclosure is not limited thereto. A plurality of light conversion particles 385 may be disposed to be separated from each other on the insulation coating film 381 so that one or more particle areas PA may be defined to be separated from each other. However, the particle areas PA according to one embodiment overlap at least the active layer 330, and the total sum of the areas occupied by the particle areas PA separated apart from each other may be 50% or more of the outer surface of the insulation coating film 381.

A method of disposing the light conversion particles 385 on the insulation coating film 381 is not particularly limited. In an example, the light conversion particles 385 may be formed through a method of immersing a semiconductor crystal, on which the insulation coating film 381 is formed, in a solution in which the light conversion particles 385 are dispersed or in a solution in which precursors of the light conversion particles 385 are dissolved. For example, the light conversion particles 385 may be disposed on the insulation coating film 381 by immersing the insulation coating film 381 in a sol-gel solution containing precursors, an ink in which the precursors are dissolved, or a solution containing the light conversion particles 385. However, the present disclosure is not limited thereto.

In some embodiments, the outer surface of the insulation coating film 381 of the insulation film 380 may be further surface-treated with other materials. In manufacturing the display device 1, the light emitting element 300 may be injected onto an electrode in a state of being dispersed in a set or predetermined ink to be deposited. Here, in order to allow the light emitting element 300 to maintain the dispersed state without (or substantially without) being agglomerated with adjacent other light emitting element 300 in the ink, the outer surface of the insulation coating film 381 may be hydrophobically or hydrophilically treated.

The light emitting element 300 may have a length l in a range from 1 μm to 10 μm or from 2 μm to 5 μm, or, for example, a length l of about 4 μm. In addition, a diameter of the light emitting element 300 may be in a range from 300 nm to 700 nm, and an aspect ratio of the light emitting element 300 may be in a range from 1.2 to 100. However, the present disclosure is not limited thereto, and a plurality of light emitting elements 300 included in the display device 1 may have different diameters according to a difference in composition of the active layers 330. In one or more embodiments, the diameter of the light emitting element 300 may be about 500 nm.

As described above, the light emitting element 300 includes the light conversion particles 385 disposed on the insulation coating film 381. The light emitting element 300 has a shape extending in one direction, and the light emitted from the light emitting element 300 may propagate in a direction parallel (e.g., substantially parallel) to the extension direction DL and in directions different therefrom. Here, the light emitted from the active layer 330 is incident on in the light conversion particles 385 disposed on the insulation coating film 381, and the light conversion particles 385 may emit the light to the side surface SA of the light emitting element 300 or amplify the intensity of light. In the light emitting element 300 according to one embodiment, an amount of light emitted in a direction different from or perpendicular (e.g., substantially perpendicular) to the extension direction DL may be increased.

In the light emitting element 300 according to one embodiment, the amount of light emitted to the side surface SA is increased so that top emission efficiency may be high even when the light emitting element 300 is disposed in a direction parallel (e.g., substantially parallel) to the target substrate SUB. Thus, unlike FIG. 5, an arrangement structure of the light emitting element 300 between the electrodes 21 and 22 on the target substrate SUB may be varied.

Figure 8:
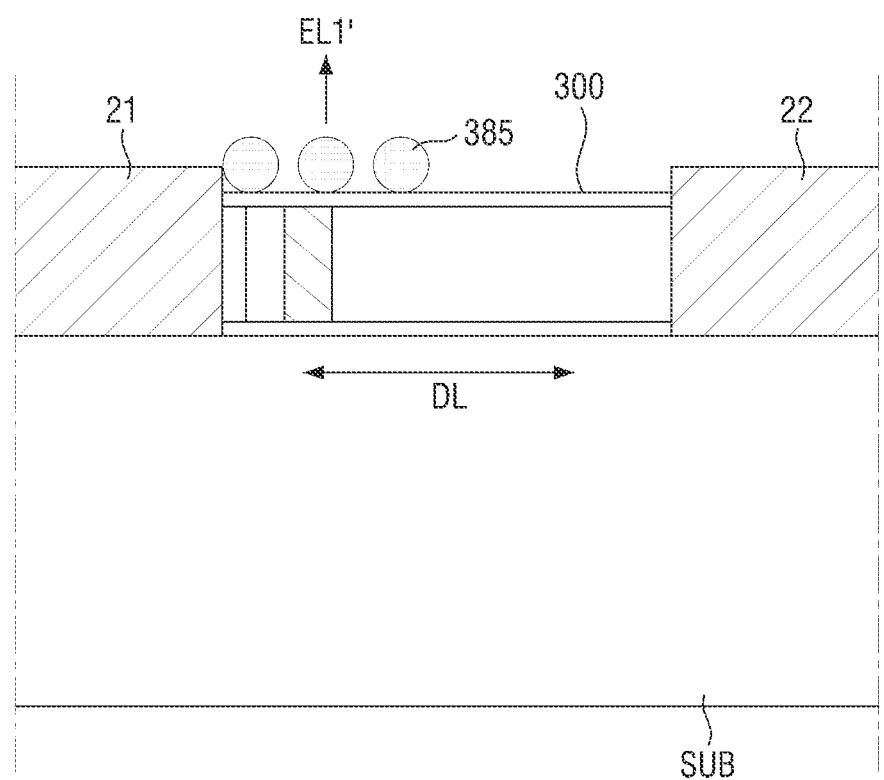
FIGS. 8 to 10 are schematic diagrams illustrating that a light emitting element is disposed on a substrate according to one embodiment.
Figure 9:
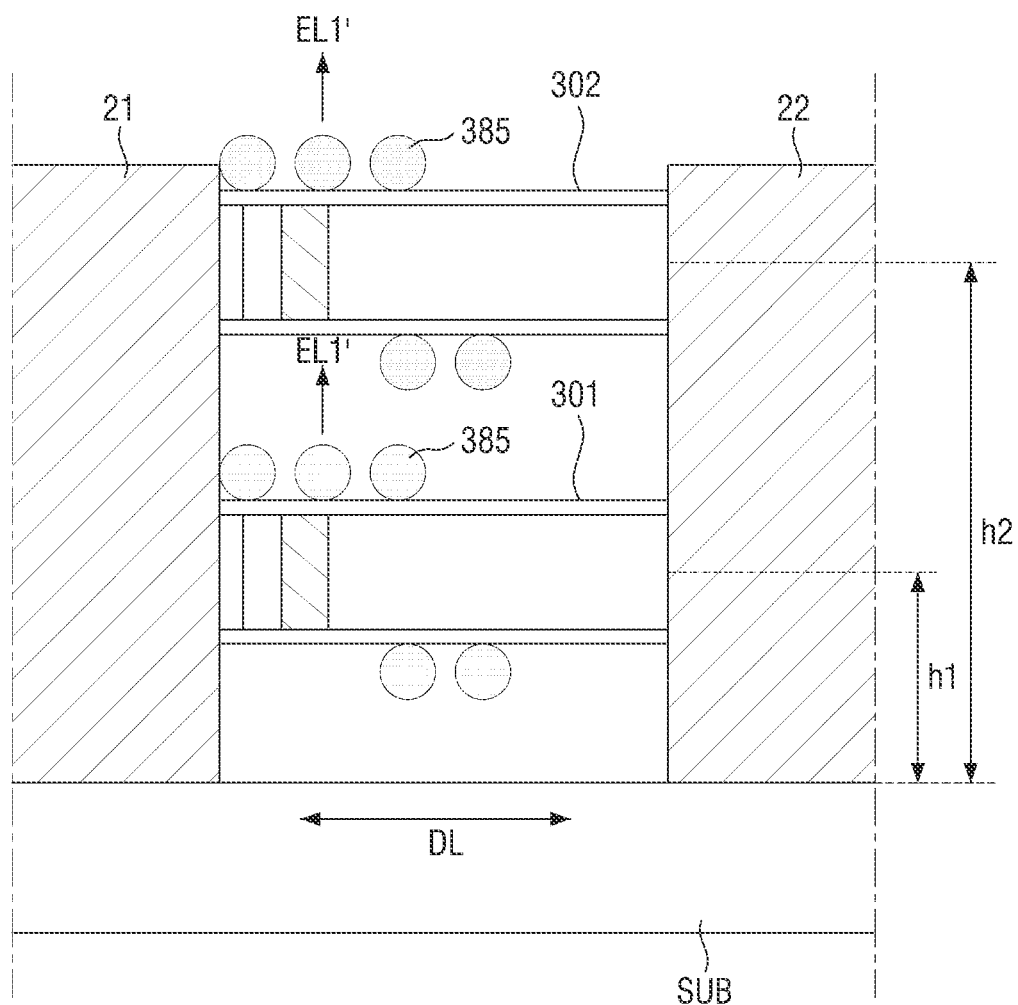
Figure 10:
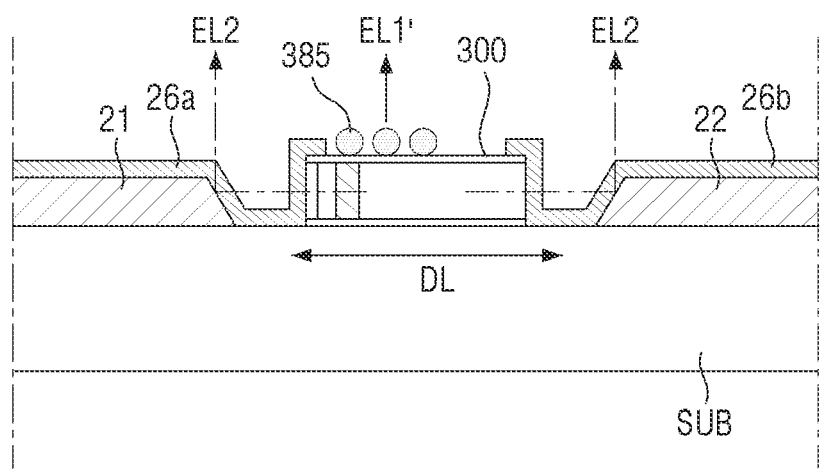

FIGS. 8 to 10 are schematic diagrams illustrating that a light emitting element is disposed on a substrate according to one embodiment.

The light emitting element 300 may be disposed on the target substrate SUB such that the extension direction DL is parallel (e.g., substantially parallel) to the target substrate SUB. However, unlike FIG. 4, the light emitting element 300 may not be necessarily disposed on the electrodes 21 and 22 and may be disposed therebetween. Hereinafter, a difference from FIG. 4 will be mainly described.

Referring to FIG. 8, according to one embodiment, the light emitting element 300 is disposed between the first electrode 21 and the second electrode 22 such that the first end portion EA1 of the light emitting element 300 may be in contact with a side surface of the first electrode 21, and the second end portion EA2 thereof may be in contact with a side surface of the second electrode 22. A distance between the first electrode 21 and the second electrode 22 may be the same as a length l of the light emitting element 300, which is measured in the extension direction DL. In FIG. 4, the side surfaces of the two end portions of the light emitting element 300 are in contact with upper surfaces of the first electrode 21 and the second electrode 22, but in FIG. 8, there is a difference in which the first end portion EA1 and the second end portion EA2 are in contact with the side surfaces of the first electrode 21 and the second electrode 22.

As described above, since the light emitting element 300 includes the light conversion particles 385, an amount of light emitted to the side surface SA may be greater than an amount of light emitted in the extension direction DL. That is, the light emitting element 300 disposed between the first electrode 21 and the second electrode 22 may emit light to the side surface SA so that the light may propagate toward an upper portion of the target substrate SUB. Even when the two end portions EA1 and EA2 of the light emitting element 300 are respectively in contact with the electrodes 21 and 22 to block, hinder, or reduce emission of light, the light emitting element 300 may emit a suitable or sufficient amount of light to the upper portion of the target substrate SUB through the side surface SA.

In one or more embodiments, the light emitting element 300 may be disposed as a plurality of light emitting elements 300 between the first electrode 21 and the second electrode 22. Each light emitting element 300 may emit a suitable or sufficient amount of light to the side surface SA, and the plurality of light emitting elements 300 may be disposed between the first electrode 21 and the second electrode 22 in a direction perpendicular (e.g., substantially perpendicular) to one surface of the target substrate SUB.

Referring to FIG. 9, the light emitting element 300 according to one embodiment includes a first light emitting element 301 and a second light emitting element 302, and the first light emitting element 301 and the second light emitting element 302 may have different separation distances from one surface of a target substrate SUB. As in FIG. 8, both end portions EA1 and EA2 of the first light emitting element 301 and the second light emitting element 302 may respectively be in contact with the side surfaces of the first electrode 21 and the second electrode 22. However, unlike FIG. 8, there is a difference in which the light emitting element 300 of FIG. 9 is disposed to be separated from the target substrate SUB between the first electrode 21 and the second electrode 22. In addition, the first light emitting element 301 and the second light emitting element 302 may have different separation distances from the target substrate SUB.

The first light emitting element 301 and the second light emitting element 302 are disposed in a direction perpendicular (e.g., substantially perpendicular) from one surface of the target substrate SUB, for example, to be separated from the upper surface of the target substrate SUB. A distance h1 between the first light emitting element 301 and the target substrate SUB may be smaller than a distance h2 between the second light emitting element 302 and the target substrate SUB. That is, in the drawing, the first light emitting element 301 may be located below the second light emitting element 302.

A large number of light emitting elements 300 is disposed in a narrow area between the first electrode 21 and the second electrode 22 so that an amount of light emitted from the side surfaces SA of the light emitting elements 300 may be further increased. That is, the first light emitting element 301 and the second light emitting element 302, which constitute a plurality of layers, are disposed between the electrodes 21 and 22 so that an amount of light emitted per unit area of the target substrate SUB may be increased.

According to one or more embodiments, the light emitting element 300 may be disposed between the first electrode 21 and the second electrode 22 to be separated therefrom and contact electrodes 26 may be further disposed between the light emitting element 300 and the first and second electrodes 21 and 22.

Referring to FIG. 10, the light emitting element 300 may be disposed between the first electrode 21 and the second electrode 22, and both end portions EA1 and EA2 may be respectively disposed to be separated from the electrodes 21 and 22. The contact electrodes 26 are further disposed to be in contact with the light emitting element 300 and the electrodes 21 and 22 in an area in which the light emitting element 300 and the electrodes 21 and 22 are separated from each other.

In one or more embodiments, the contact electrodes 26 include a first contact electrode 26a in contact with the first end portion EA1 of the light emitting element 300 and the first electrode 21, and a second contact electrode 26b in contact with the second end portion EA2 of the light emitting element 300 and the second electrode 22. Unlike FIGS. 8 and 9, in FIG. 10, the light emitting element 300 may not be in direct contact with the electrodes 21 and 22 but may be connected to the electrodes 21 and 22 through the contact electrodes 26. Although not shown in the drawing, when a length of the light emitting element 300 measured in the extension direction DL is equal to a distance between the electrodes 21 and 22, at least one end portion of the light emitting element 300 may not be connected to the electrode 21 or 22. To prevent (or reduce a likelihood or occurrence of) this, the distance between the first electrode 21 and the second electrode 22 may be greater than the length l of the light emitting element 300, and the light emitting element 300 may be connected to the electrodes 21 and 22 through the contact electrodes 26.

In addition, in an example, each of the electrodes 21 and 22 may include a material having high reflectivity. As shown in the drawing, second emitted light EL2 may be emitted from the two end portions EA1 and EA2 of the light emitting element 300 to propagate toward the electrodes 21 and 22. When each of the electrodes 21 and 22 includes a material having high reflectivity, the second emitted light EL2 emitted in the extension direction DL of the light emitting element 300 may be reflected in a direction upward from the target substrate SUB. Thus, top emission efficiency of the light emitting element 300 disposed on the target substrate SUB may further be improved.

The light emitting element 300 may emit light in a set or specific wavelength range, for example, blue light, and the display device 1 according to one embodiment may include at least one light emitting element 300 to display light of a set or specific color.

Figure 11:
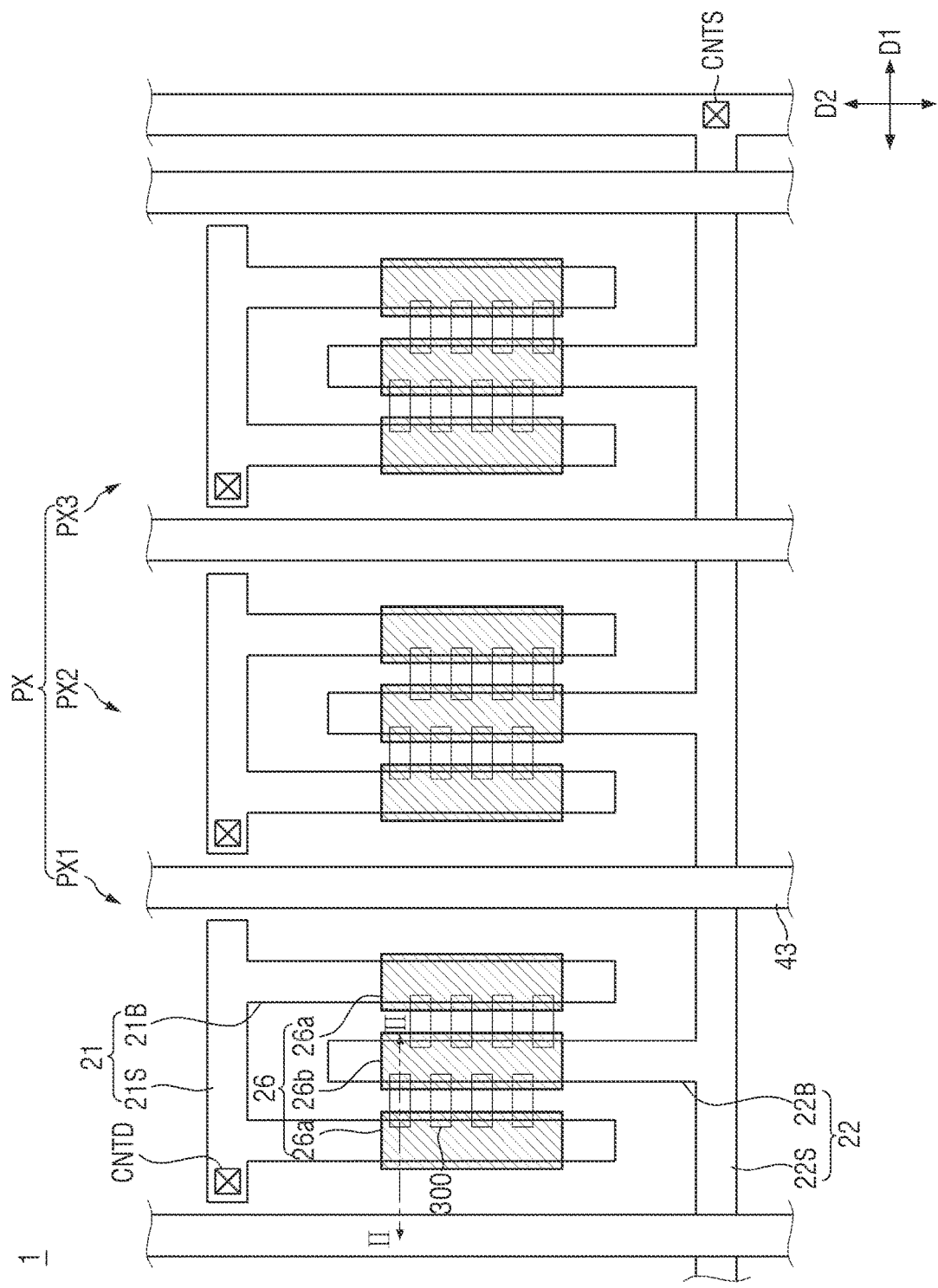
FIG. 11 is a plan view illustrating a display device according to one embodiment.

FIG. 11 is a plan view illustrating a display device including a light emitting element manufactured by a method according to one embodiment.

Referring to FIG. 11, the display device 1 may include a plurality of pixels PX. Each of the pixels PX may include one or more light emitting elements 300, which emit light in a set or specific wavelength range, to display a set or specific color.

Each of the plurality of pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be red, the second color may be green, and the third color may be blue, but the present disclosure is not limited thereto, and each sub-pixel PXn may emit light of the same color. In addition, although each of the pixels PX is illustrated as including three sub-pixels in FIG. 11, the present disclosure is not limited thereto, and each of the pixels PX may include a larger number of sub-pixels.

Each sub-pixel PXn of display device 1 may include areas defined as an emission area and a non-emission area. The emission area is defined as an area in which the light emitting elements 300 included in the display device 1 are disposed to emit light in a set or specific wavelength range. The non-emission area is an area other than the emission area and may be defined as an area in which the light emitting elements 300 are not disposed and light is not emitted therefrom.

The sub-pixel PXn of display device 1 may include a plurality of banks 40, a plurality of electrodes 21 and 22, and the light emitting elements 300.

The plurality of electrodes 21 and 22 may be electrically connected to the light emitting elements 300 and may receive a set or predetermined voltage so as to allow the light emitting elements 300 to emit light. Further, at least a portion of each of the electrodes 21 and 22 may be utilized to form an electric field in the sub-pixel PXn so as to align the light emitting elements 300.

In one or more embodiments, the plurality of electrodes 21 and 22 may include a first electrode 21 and a second electrode 22. In an example, the first electrode 21 may be a pixel electrode separated for each sub-pixel PXn, and the second electrode 22 may be a common electrode commonly connected along each sub-pixel PXn. One of the first electrode 21 and the second electrode 22 may be an anode electrode of the light emitting element 300, and the other may be a cathode electrode of the light emitting element 300. However, the present disclosure is not limited thereto and the reverse of the above case may be possible.

The first electrode 21 and the second electrode 22 may include electrode stem portions 21S and 22S disposed to extend in a first direction D1 and include electrode branch portions 21B and 22B branching and extending from the electrode stem portions 21S and 22S in a second direction D2 intersecting the first direction D1, respectively.

The first electrode 21 may include a first electrode stem portion 21S disposed to extend in the first direction D1, and at least one first electrode branch portion 21B branching from the first electrode stem portion 21S to extend in the second direction D2.

Both ends of the first electrode stem portion 21S of any one pixel may be separated to be terminated between the sub-pixels PXn and disposed substantially collinear with a first electrode stem portion 21S of an adjacent PXn in the same row (e.g., adjacent in the first direction D1). Thus, the first electrode stem portions 21S disposed in respective sub-pixels PXn may apply different electrical signals to respective first electrode branch portions 21B, and the first electrode branch portions 21B may each be driven separately.

The first electrode branch portion 21B branches from at least a portion of the first electrode stem portion 21S and is disposed to extend in the second direction D2. The first electrode branch portion 21B may be terminated in a state of being separated from the second electrode stem portion 22S which is disposed opposite to the first electrode stem portion 21S.

The second electrode 22 may include the second electrode stem portion 22S which extends in the first direction D1 and is disposed to be separated from and opposite to the first electrode stem portion 21S, and the second electrode branch portion 22B which branches from the second electrode stem portion 22S and is disposed to extend in the second direction D2. However, both end portions of the second electrode stem portion 22S may extend to a plurality of adjacent sub-pixels PXn in the first direction D1. Thus, both ends of the second electrode stem portion 22S of a set or arbitrary pixel may be connected to a second electrode stem portion 22S of an adjacent pixel PX between the pixels PX.

The second electrode branch portion 22B may be separated from and opposite to the first electrode branch portion 21B and terminated in a state of being separated from the first electrode stem portion 21S. That is, one end portion of the second electrode branch portion 22B may be connected to the second electrode stem portion 22S, and the other end portion thereof may be disposed in the sub-pixel PXn in a state of being separated from the first electrode stem portion 21S.

In the drawing, two first electrode branch portions 21B are illustrated as being disposed and the second electrode branch portion 22B is illustrated as being disposed between the two first electrode branch portions 21B, but the present disclosure is not limited thereto.

The plurality of banks 40 may include a third bank 43 disposed at a boundary between the sub-pixels PXn, and a first bank 41 and a second bank 42 which are respectively disposed below the electrodes 21 and 22. Although the first bank 41 and the second bank 42 are not illustrated in the drawing, the first bank 41 and the second bank 42 may be disposed below the first electrode branch portion 21B and the second electrode branch portion 22B, respectively.

The third bank 43 may be disposed at a boundary between the sub-pixels PXn. End portions of the plurality of first electrode stem portions 21S may be separated from each other to be terminated based on the third bank 43. The third bank 43 may extend in the second direction D2 and may be disposed at the boundary between the sub-pixels PXn disposed in the first direction D1. However, the present disclosure is not limited thereto, and the third bank 43 may extend in the first direction D1 and may be disposed at the boundary between the sub-pixel PXn disposed in the second direction D2. The third bank 43 may include the same material as the first bank 41 and the second bank 42 and may be formed in substantially the same process.

Although not shown in the drawing, a first insulating layer 51 may be disposed in each sub-pixel PXn to entirely cover each sub-pixel PXn including the first electrode branch portion 21B and the second electrode branch portion 22B. The first insulating layer 51 may protect each of the electrodes 21 and 22 and, concurrently (e.g., simultaneously), insulate the electrodes 21 and 22 from each other so as not to be in direct contact with each other.

The plurality of light emitting elements 300 may be disposed between the first electrode branch portion 21B and the second electrode branch portion 22B. One end portions of at least some of the plurality of light emitting elements 300 may be electrically connected to the first electrode branch portion 21B and the other end portions thereof may be electrically connected to the second electrode branch portion 22B.

The plurality of light emitting elements 300 may be separated from each other in the second direction D2 and disposed substantially parallel to each other. A separation distance between the light emitting elements 300 is not particularly limited. In some cases, a plurality of light emitting elements 300 may be disposed adjacent to each other to form a group, and another plurality of light emitting elements 300 may be grouped in a state of being spaced apart at a certain interval, may have a nonuniform density, and may be oriented in one direction to be disposed.

As described above, the light emitting element 300 may include light conversion particles 385 disposed on the insulation coating film 381 and emit light toward an upper portion of the display device 1. That is, display device 1 may include the light emitting element 300 of FIG. 1, and thus top emission efficiency may be improved.

The contact electrode 26 may be disposed on the first electrode branch portion 21B and the second electrode branch portion 22B. However, the contact electrode 26 may be substantially disposed on the first insulating layer 51, and at least a portion of the contact electrode 26 may be in contact with or electrically connected to the first electrode branch portion 21B and the second electrode branch portion 22B.

A plurality of contact electrodes 26 may be disposed to extend in the second direction D2 and disposed to be separated from each other in the first direction D1. The contact electrode 26 may be in contact with at least one end portion of the light emitting element 300, and the contact electrode 26 may be in contact with the first electrode 21 or the second electrode 22 to receive an electrical signal. Thus, the contact electrode 26 may transmit an electrical signal, which is transmitted from each of the electrodes 21 and 22, to the light emitting element 300.

The contact electrode 26 may include a first contact electrode 26a and a second contact electrode 26b. The first contact electrode 26a may be disposed on the first electrode branch portion 21B to be in contact with one end portion of the light emitting element 300, and the second contact electrode 26b may be disposed on the second electrode branch portion 22B to be in contact with the other end portion thereof.

The first electrode stem portion 21S and the second electrode stem portion 22S may be electrically connected to a circuit element layer of the display device 1 through respective contact holes, for example, a first electrode contact hole CNTD and a second electrode contact hole CNTS. In the drawing, one second electrode contact hole CNTS is illustrated as being formed in the second electrode stem portion 22S of each of the plurality of sub-pixels PXn. However, the present disclosure is not limited thereto, and in some cases, the second electrode contact hole CNTD may be formed in each sub-pixel PXn.

In addition, although not shown in the drawing, the display device 1 may include a second insulating layer 52 (see FIG. 12) and a passivation layer 55 (see FIG. 12) which are disposed to cover at least a portion of each of the electrodes 21 and 22 and the light emitting element 300. An arrangement and a structure between the above components will be further described below with reference to FIG. 12.

Figure 12:
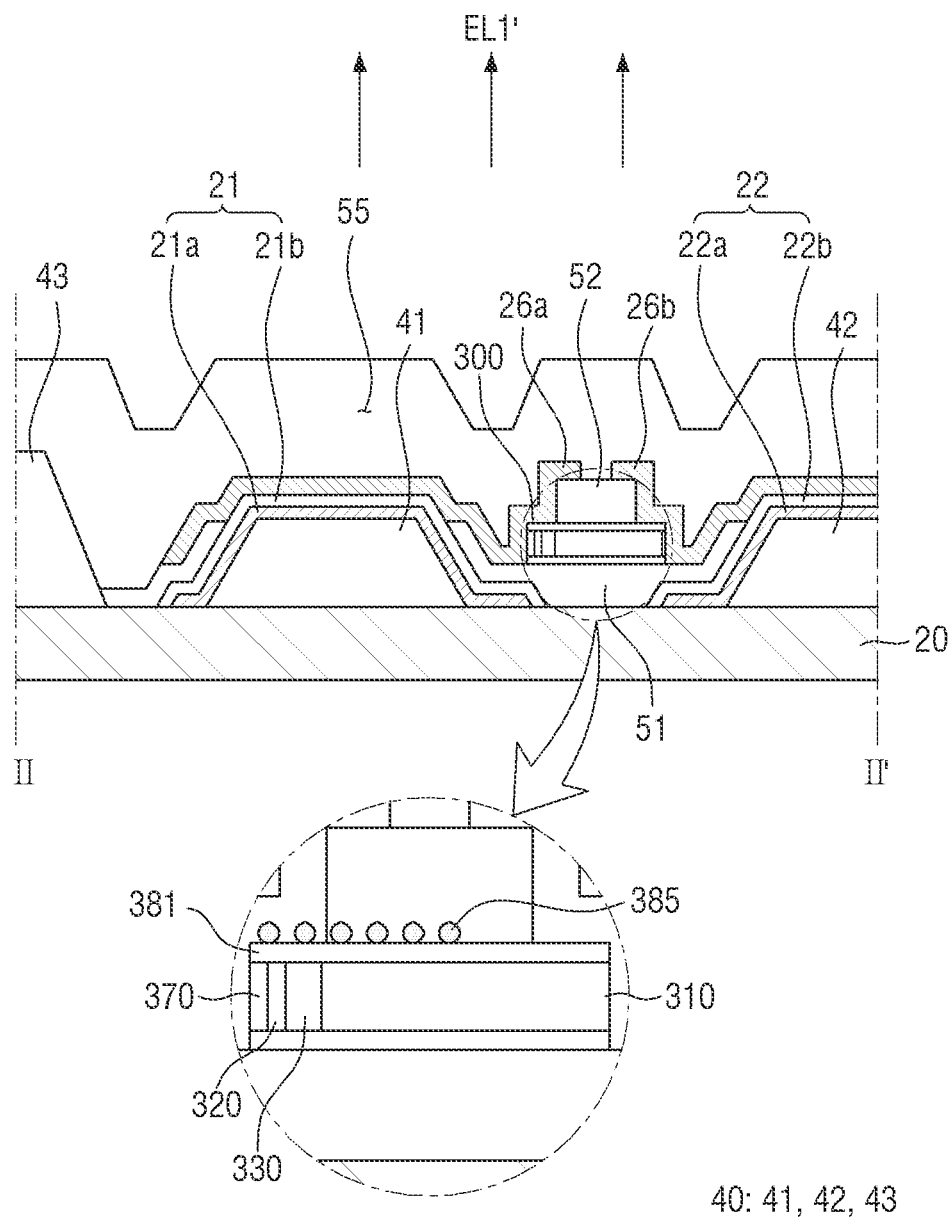
FIG. 12 is a cross-sectional view taken along line II-II' of FIG. 11.

FIG. 12 is a partial cross-sectional view taken along line II-II' of FIG. 11.

FIG. 12 illustrates a cross-sectional view of the first sub-pixel PX1 and may be equally applied to another pixel PX or another sub-pixel PXn. FIG. 22 illustrates a cross section crossing one end portion and the other end portion of an arbitrary light emitting element 300.

Meanwhile, although not shown in FIG. 12, the display device 1 may further include circuit element layers located below the electrodes 21 and 22. The circuit element layer may include a plurality of semiconductor layers and a plurality of conductive patterns and may include at least one transistor and a power line. However, a further detailed description thereof will not be provided below.

Referring to FIG. 12, the display device 1 may include a via layer 20, the electrodes 21 and 22 disposed on the via layer 20, and the light emitting element 300. A circuit element layer (not shown) may be further disposed below the via layer 20. The via layer 20 may include an organic insulating material and perform a surface planarization function.

A plurality of banks 41, 42, and 43 are disposed on the via layer 20. The plurality of banks 41, 42, and 43 may be disposed to be separated from each other in each sub-pixel PXn. The plurality of banks 41, 42, and 43 may include the first bank 41 and the second bank 42 which are disposed adjacent to a central portion of the sub-pixel PXn, and the third bank 43 disposed at a boundary between the sub-pixels PXn.

When the ink is sprayed using an inkjet printing device during the manufacturing of the display device 1, the third bank 43 may perform a function of blocking the ink from crossing the boundary of the sub-pixel PXn. In addition, when the display device 1 further includes another member, the other member may be disposed on the third bank 43 and the third bank 43 may perform a function of supporting the other member. However, the present disclosure is not limited thereto.

The first bank 41 and the second bank 42 are disposed to be separated from and opposite to each other. The first electrode 21 may be disposed on the first bank 41, and the second electrode 22 may be disposed on the second bank 42. Referring to FIGS. 11 and 12, it can be understood that the first electrode branch portion 21B is disposed on the first bank 41, and the second bank 42 is disposed on the second bank 42.

As described above, the first bank 41, the second bank 42, and the third bank 43 may be formed in substantially the same process. Thus, the banks 41, 42, and 43 may constitute a single grid pattern. Each of the plurality of banks 41, 42, and 43 may include polyimide (PI).

Each of the plurality of banks 41, 42, and 43 may have a structure in which at least a portion protrudes from the via layer 20. The banks 41, 42, and 43 may protrude upward based on a plane on which the light emitting element 300 is disposed, and at least a part of each of the protruding portions may have a slope. A shape of each of the banks 41, 42, and 43 having the protruding structures is not particularly limited. As shown in the drawing, the first bank 41 and the second bank 42 protrude to the same height, and the third bank 43 may have a shape protruding to a higher position.

Reflective layers 21a and 22a may be disposed on the first bank 41 and the second bank 42, and electrode layers 21b and 22b may be disposed on the reflective layers 21a and 22a. The reflective layers 21a and 22a and the electrode layers 21b and 22b may constitute the electrodes 21 and 22, respectively.

The reflective layers 21a and 22a include a first reflective layer 21a and a second reflective layer 22a. The first reflective layer 21a may cover the first bank 41, and the second reflective layer 22a may cover the second bank 42. Portions of the reflective layers 21a and 22a are electrically connected to the circuit element layer through a contact hole passing through the via layer 20.

Each of the reflective layers 21a and 22a may include a material having high reflectivity to reflect light emitted from the light emitting element 300. For example, each of the reflective layers 21a and 22a may include a material such as Ag, Cu, ITO, IZO, and/or ITZO, but the present disclosure is not limited thereto.

The electrode layers 21b and 22b include a first electrode layer 21b and a second electrode layer 22b. The electrode layers 21b and 22b may have patterns substantially equal to patterns of the reflective layers 21a and 22a. The first reflective layer 21a and the first electrode layer 21b are disposed to be separated from the second reflective layer 22a and the second electrode layer 22b.

Each of the electrode layers 21b and 22b includes a transparent conductive material, and thus emission light EL emitted from the light emitting element 300 may be incident on the reflective layers 21a and 22a. For example, each of the electrode layers 21b and 22b may include a material such as ITO, IZO, and/or ITZO, but the present disclosure is not limited thereto.

In some embodiments, the reflective layers 21a and 22a and the electrode layers 21b and 22b may form a structure in which one or more transparent conductive layers such as ITO, IZO, and/or ITZO, and one or more metal layers such as Ag and/or Cu are stacked. For example, the reflective layers 21a and 22a and the electrode layers 21b and 22b may form a stacked structure of ITO/Ag/ITO/IZO.

In some embodiments, the first electrode 21 and the second electrode 22 may be formed as a single layer. That is, the reflective layers 21a and 22a and the electrode layers 21b and 22b may be formed as a single layer to transmit an electrical signal to the light emitting element 300 and, concurrently (e.g., simultaneously), reflect light. For example, each of the first electrode 21 and the second electrode 22 may include a conductive material (e.g., an electrically conductive material) having high reflectivity and may be an alloy containing Al, nickel (Ni), and/or lanthanum (La). However, the present disclosure is not limited thereto.

The first insulating layer 51 is disposed to partially cover the first electrode 21 and the second electrode 22. The first insulating layer 51 may be disposed to cover most of the upper surfaces of the first electrode 21 and the second electrode 22 and may expose portions of the first electrode 21 and the second electrode 22. The first insulating layer 51 may be disposed to partially cover an area in which the first electrode 21 is separated from the second electrode 22 and an area opposite to the area in which the first electrode 21 is separated from the second electrode 22.

The first insulating layer 51 is disposed to expose relatively flat upper surfaces of the first electrode 21 and the second electrode 22 and disposed to allow the electrodes 21 and 22 to overlap inclined surfaces of the first bank 41 and the second bank 42. The first insulating layer 51 forms a flat upper surface to allow the light emitting element 300 to be disposed, and the flat upper surface extend toward the first electrode 21 and the second electrode 22 in one direction. The extension portion of the first insulating layer 51 is terminated at inclined surfaces of the first electrode 21 and the second electrode 22. Thus, the contact electrodes 26 may be in contact the exposed first electrode 21 and the exposed second electrode 22 and may be in smooth contact with the light emitting element 300 on the flat upper surface of the first insulating layer 51.

The first insulating layer 51 may protect the first electrode 21 and the second electrode 22 and, concurrently (e.g., simultaneously), insulate the first electrode 21 from the second electrode 22. In addition, the first insulating layer 51 may prevent the light emitting element 300 disposed thereon from being damaged by direct contact with other members (or may reduce a likelihood or degree of such damage).

The light emitting element 300 may be disposed on the first insulating layer 51. At least one light emitting element 300 may be disposed on the first insulating layer 51 between the first electrode 21 and the second electrode 22. The light emitting element 300 may include a plurality of layers disposed in a direction horizontal to the via layer 20.

The light emitting element 300 of the display device 1 according to one embodiment may include the conductivity type semiconductors and the active layer, which are described above, and the conductivity type semiconductors and the active layer may be sequentially disposed on the via layer 20 in a horizontal direction. As shown in the drawing, in the light emitting element 300, the first conductivity type semiconductor 310, the active layer 330, the second conductivity type semiconductor 320, and the conductive electrode layer 370 may be sequentially disposed on the via layer 20 in the horizontal direction. However, the present disclosure is not limited thereto. The order of the plurality of layers disposed in the light emitting element 300 may be reversed. In some cases, when the light emitting element 300 has another structure, the plurality of layers may be disposed in a direction perpendicular (e.g., substantially perpendicular) to the via layer 20.

The second insulating layer 52 may be partially disposed on the light emitting element 300. The second insulating layer 52 may protect the light emitting element 300 and, concurrently (e.g., simultaneously), perform a function of fixing the light emitting element 300 during a process of manufacturing the display device 1. The second insulating layer 52 may be disposed to surround an outer surface of the light emitting element 300. That is, a portion of a material of the second insulating layer 52 may be disposed between a bottom surface of the light emitting element 300 and the first insulating layer 51. The second insulating layer 52 may extend between the first electrode branch portion 21B and the second electrode branch portion 22B in the second direction D2 to have an island shape or a linear shape when viewed in a plan view.

The contact electrodes 26 are disposed on the electrodes 21 and 22 and the second insulating layer 52. The first contact electrode 26a and the second contact electrode 26b are disposed to be separated from each other on the second insulating layer 52. Thus, the second insulating layer 52 may insulate the first contact electrode 26a from the second contact electrode 26b.

The first contact electrode 26a may be in contact with at least the first electrode 21, which is exposed due to patterning of the first insulating layer 51, and one end portion of the light emitting element 300. The second contact electrode 26b may be in contact with at least the second electrode 22, which is exposed due to the patterning of the first insulating layer 51, and the other end portion of the light emitting element 300. The first and second contact electrodes 26a and 26b may be in contact with side surfaces of the two end portions of the light emitting element 300, for example, the first conductivity type semiconductor 310, the second conductivity type semiconductor 320, or the conductive electrode layer 370. As described above, the first insulating layer 51 forms the flat upper surface so that the contact electrodes 26 may be in smooth contact with the side surfaces of the light emitting element 300.

The contact electrode 26 may include a conductive material. For example, the contact electrode 260 may include ITO, IZO, ITZO, Al, and/or the like. However, the present disclosure is not limited thereto.

The passivation layer 55 may be formed on the second insulating layer 52 and the contact electrodes 26 and may serve to perform a function of protecting members disposed on the via layer 20 from an external environment.

Each of the first insulating layer 51, the second insulating layer 52, and the passivation layer 55, which are described above, may include an inorganic insulating material and/or an organic insulating material. In an example, each of the first insulating layer 51, and the passivation layer 55 may include a material such as $SiO_x$, $SiO_xN_y$, $Al_2O_3$, aluminum nitride (AlN), and/or the like. The second insulating layer 52 may be made of an organic insulating material including a photoresist and/or the like. However, the present disclosure is not limited thereto.

As described above, the display device 1 includes the plurality of banks 40, particularly, the first bank 41 and the second bank 42, and the electrodes 21 and 22 may be disposed on the inclined surfaces of the banks 41 and 42. Among the light emitted from the light emitting element 300, the second emitted light EL2 emitted in the extension direction DL of the light emitting element 300 may propagate toward the electrodes 21 and 22 formed on the inclined surfaces of the banks 41 and 42. The electrodes 21 and 22 including the reflective layers 21a and 22a may reflect the incident second emitted light EL2 toward the upper portion of the light emitting element 300, and top emission efficiency of the display device 1 may be increased.

However, the light emitting element 300 according to one embodiment may include the light conversion particles 385 disposed on the insulation coating film 381 to emit the first emitted light EL1 in a direction perpendicular (e.g., substantially perpendicular) to the extension direction DL of the light emitting element 300. When the display device 1 includes the light emitting element 300 of FIG. 1, even when the second emitted light EL2 is not reflected to the upper portion of the light emitting element 300 through the inclined banks 41 and 42, the display device 1 may emit a suitable or sufficient amount of emitted light through the light conversion particles 385 toward the upper portion of the light emitting element 300. That is, in a display device 1 according to another embodiment, the banks, particularly, the first bank 41 and the second bank 42, may be omitted.

Figure 13:
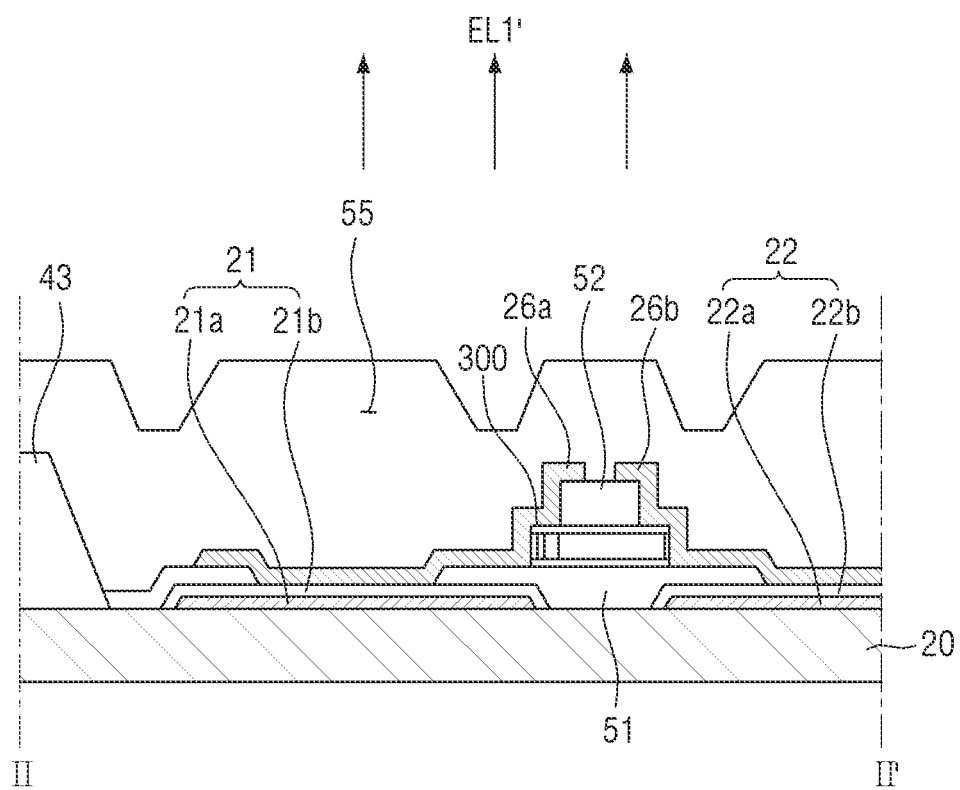
FIG. 13 is a schematic cross-sectional view illustrating a display device according to another embodiment.

FIG. 13 is a cross-sectional view illustrating a display device according to another embodiment.

Referring to FIG. 13, in the display device 1, the first bank 41 and the second bank 42 may be omitted, and a first electrode 21 and a second electrode 22 may be directly disposed on a via layer 20. Although not shown in FIG. 13, as shown in FIG. 12, light conversion particles 385 may be disposed on an insulation coating film 381 of an outer surface of the light emitting element 300, and light emitted from an active layer 330 of a light emitting element 300 may propagate toward an upper portion based on the via layer 20.

Consequently, unlike the display device 1 of FIG. 12, there is an advantage in a process in which an operation of forming the banks 41 and 42 is omitted, and a step between members disposed on the via layer 20 may be reduced or omitted. In addition, since top emission efficiency may be suitably or sufficiently obtained even when the light emitted from the light emitting element 300 is not reflected, the reflective layers 21a and 22a may be omitted from the electrodes 21 and 22. Descriptions of other members are the same as those described above with reference to FIG. 12 and thus will not be repeated here.

The display device 1 may further include a light emitting element 300 having a structure different from the structure of the light emitting element 300 of FIG. 1.

FIG. 14 is a schematic diagram of a light emitting element according to another embodiment.

Referring to FIG. 14, a light emitting element 300' may be formed such that a plurality of layers are not stacked in one direction and each of the plurality of layers surrounds an outer surface of another layer. The light emitting element 300' of FIG. 13 is the same as the light emitting element 30 of FIG. 1 except that shapes of the layers are partially different from each other. Hereinafter, the same content will be omitted and a difference will be described.

According to one embodiment, a first conductivity type semiconductor 310' may extend in one direction and both end portions thereof may be formed to be inclined toward a central portion thereof. The first conductivity type semiconductor 310' of FIG. 13 may have a shape in which a rod-shaped or cylindrical main body and conical-shaped end portions on upper and lower portions of the main body are formed. An upper end portion of the main body may have a slope that is steeper than a slope of a lower end portion thereof.

An active layer 330' is disposed to surround an outer surface of the main body of the first conductivity type semiconductor 310'. The active layer 330' may have an annular shape extending in one direction. The active layer 330' may not be formed on upper and lower end portions of the first conductivity type semiconductor 310'. That is, the active layer 330, may be in contact with only a parallel side surface of the first conductivity type semiconductor 310'.

A second conductivity type semiconductor 320' is disposed to surround an outer surface of the active layer 330' and the upper end portion of the first conductivity type semiconductor 310'. The second conductivity type semiconductor 320' may include an annular-shaped main body extending in one direction and an upper end portion having a side surface formed to be inclined. That is, the second conductivity type semiconductor 320' may be in direct contact with a parallel side surface of the active layer 330' and an inclined upper end portion of the first conductivity type semiconductor 310. However, the second conductivity type semiconductor 320' is not formed in the lower end portion of the first conductivity type semiconductor 310'.

An electrode material layer 370' is disposed to surround an outer surface of the second conductivity type semiconductor 320'. That is, a shape of the electrode material layer 370' may be substantially the same as a shape of the second conductivity type semiconductor 320'. That is, the electrode material layer 370' may be entirely in contact with the outer surface of the second conductivity type semiconductor 320'.

An insulation film 380' may be disposed to surround the electrode material layer 370' and the outer surface of the first conductivity type semiconductor 310'. The insulation film 380' may be in direct contact with, in addition to the electrode material layer 370', the lower end portion of the first conductivity type semiconductor 310', and exposed lower end portions of the active layer 330' and the second conductivity type semiconductor 320'.

Even in the light emitting element 300' of FIG. 14, the insulation film 380' includes an insulation coating film 381' and light conversion particles 385', and thus the light emitting element 300' may emit a suitable or sufficient amount of light in a direction perpendicular (e.g., substantially perpendicular) to a direction in which the light emitting element 300' extends. A detailed description thereof is the same as the above description and thus will not be repeated here.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

The invention claimed is:

1. A light emitting element comprising:
a first conductivity type semiconductor doped with a dopant having a first polarity;
a second conductivity type semiconductor doped with a dopant having a second polarity opposite to the first polarity;
an active layer between the first conductivity type semiconductor and the second conductivity type semiconductor; and
an insulation film which surrounds at least a side surface of the active layer;
wherein the insulation film comprises an insulation coating film and at least one light conversion particle on at least a portion of the insulation coating film,
wherein a particle area is defined as an area in which the at least one light conversion particle is on the insulation coating film,
wherein the particle area is on the insulation coating film to overlap at least the active layer, and
wherein a ratio of the particle area to an area of an outer surface of the insulation coating film is in a range from 0.5 to 0.6.

2. The light emitting element of claim 1, wherein the first conductivity type semiconductor, the active layer, and the second conductivity type semiconductor are arranged in a first direction, and the active layer emits light.

3. The light emitting element of claim 2, wherein the light emitted from the active layer comprises a first emitted light that propagates toward both ends of the light emitting element in the first direction, and a second emitted light that propagates in a second direction different from the first direction.

4. The light emitting element of claim 3, wherein at least a portion of the second emitted light is incident on the at least one light conversion particle and is emitted from the active layer in a direction perpendicular to the first direction.

5. The light emitting element of claim 4, wherein, in the light emitting element, an amount of the light emitted in the direction perpendicular to the first direction is greater than an amount of the light emitted in the first direction.

6. The light emitting element of claim 2, wherein the at least one light conversion particle comprises at least any one selected from a first light conversion particle that scatters incident light emitted from the active layer, and a second light conversion particle that amplifies the intensity of the incident light.

7. The light emitting element of claim 6, wherein the first light conversion particle comprises at least any one selected from among silicon nitride ($Si_3N_4$), silicon dioxide ($SiO_2$), aluminum oxide ($Al_2O_3$), hafnium oxide ($HfO_2$), yttrium oxide ($Y_2O_3$), and titanium dioxide ($TiO_2$).

8. The light emitting element of claim 7, wherein a diameter of the first light conversion particle is in a range from 100 nm to 2000 nm.

9. The light emitting element of claim 6, wherein the second light conversion particle comprises at least any one selected from among gold (Au), silver (Ag), copper (Cu), and aluminum (Al).

10. The light emitting element of claim 9, wherein a diameter of the second light conversion particle is in a range from 10 nm to 300 nm.

11. The light emitting element of claim 1, wherein the particle area has a shape extending in the first direction.

12. The light emitting element of claim 1, wherein the light emitting element has a length in a range from 4 μm to 7 μm and an aspect ratio in a range from 1.2 to 100.

* * * * *